United States Patent
Kano

(10) Patent No.: US 12,355,449 B2
(45) Date of Patent: Jul. 8, 2025

(54) PHASE INTERPOLATOR CIRCUIT, RECEPTION CIRCUIT, AND SEMICONDUCTOR INTEGRATED CIRCUIT

(71) Applicant: Socionext Inc., Kanagawa (JP)

(72) Inventor: Hideki Kano, Kanagawa (JP)

(73) Assignee: SOCIONEXT INC., Yokohama (JP)

(*) Notice: Subject to any disclaimer, the term of this patent is extended or adjusted under 35 U.S.C. 154(b) by 55 days.

(21) Appl. No.: 18/351,902

(22) Filed: Jul. 13, 2023

(65) Prior Publication Data

US 2023/0361763 A1 Nov. 9, 2023

Related U.S. Application Data

(63) Continuation of application No. PCT/JP2021/003969, filed on Feb. 3, 2021.

(51) Int. Cl.
*H03K 5/13* (2014.01)
*H03K 17/687* (2006.01)

(52) U.S. Cl.
CPC ............ *H03K 5/13* (2013.01); *H03K 17/6871* (2013.01)

(58) Field of Classification Search
None
See application file for complete search history.

(56) References Cited

U.S. PATENT DOCUMENTS 9,496,860 B2 * 11/2016 Chaivipas ................ H03K 5/13
2008/0061847 A1 3/2008 Nakagawa

| 2014/0211898 A1 | 7/2014 | Katoh |
| 2016/0182216 A1 | 6/2016 | Bonaccio et al. |
| 2019/0007056 A1 | 1/2019 | Kano et al. |

(Continued)

FOREIGN PATENT DOCUMENTS

| JP | 2008-072234 A | 3/2008 |
| JP | 2014-146869 A | 8/2014 |

(Continued)

OTHER PUBLICATIONS

International Search Report (ISR) dated Mar. 23, 2021 issued in International Patent Application No. PCT/JP2021/003969, with English translation.

(Continued)

*Primary Examiner* — Cassandra F Cox
(74) *Attorney, Agent, or Firm* — Rimon P.C.

(57) ABSTRACT

A phase interpolator circuit that generates an output clock signal having a phase according to a PI code based on input clock signals, the phase interpolator circuit includes: a first generation circuit configured to generate a first intermediate current based on a first input clock signal according to the PI code; a second generation circuit configured to generate a second intermediate current based on a second input clock signal having a first phase difference from the first input clock signal according to the PI code; a synthesis circuit configured to synthesize the first and second intermediate currents to generate the output clock signal; and a correction circuit configured to correct a current amount of at least one of the intermediate currents based on a correction current according to a correction code set according to at least an amount of shift of the first phase difference from a certain value.

21 Claims, 18 Drawing Sheets

(56) References Cited

U.S. PATENT DOCUMENTS

2021/0067165 A1    3/2021   Kano et al.
2023/0208411 A1*   6/2023   Foley .................... H03K 5/131
                                                      327/276

FOREIGN PATENT DOCUMENTS

JP    2016-219916 A    12/2016
WO    2017/154191 A1    9/2017

OTHER PUBLICATIONS

Written Opinion of the International Searching Authority dated Mar. 23, 2021 issued in International Patent Application No. PCT/JP2021/003969, with partial English translation.

Notice of Reasons for Refusal dated Apr. 1, 2025 issued in the corresponding Japanese Patent Application No. 2022-579220, with English translation.

* cited by examiner

FIG. 5

| PI code | I CURRNT:PIA code | sign | \|A\| | Q CURRNT:PIB code | sign | \|B\| | CORRECTION C0 code | CURRENT MIRROR ratio ∝ code A | | Q CORRECTION CURRENT code | sign | \|C\| |
|---|---|---|---|---|---|---|---|---|---|---|---|---|
| 0 | 16 | 0 | 16 | 0 | 0 | 0 | −8 | 16/16 | 1.0 | −8.0 | 1 | 8.0 |
| 1 | 15 | 0 | 15 | 1 | 0 | 1 |  | 15/16 | 0.9 | −7.5 | 1 | 7.5 |
| 2 | 14 | 0 | 14 | 2 | 0 | 2 |  | 14/16 | 0.9 | −7.0 | 1 | 7.0 |
| 3 | 13 | 0 | 13 | 3 | 0 | 3 |  | 13/16 | 0.8 | −6.5 | 1 | 6.5 |
| 4 | 12 | 0 | 12 | 4 | 0 | 4 |  | 12/16 | 0.8 | −6.0 | 1 | 6.0 |
| 5 | 11 | 0 | 11 | 5 | 0 | 5 |  | 11/16 | 0.7 | −5.5 | 1 | 5.5 |
| 6 | 10 | 0 | 10 | 6 | 0 | 6 |  | 10/16 | 0.6 | −5.0 | 1 | 5.0 |
| 7 | 9 | 0 | 9 | 7 | 0 | 7 |  | 9/16 | 0.6 | −4.5 | 1 | 4.5 |
| 8 | 8 | 0 | 8 | 8 | 0 | 8 |  | 8/16 | 0.5 | −4.0 | 1 | 4.0 |
| 9 | 7 | 0 | 7 | 9 | 0 | 9 |  | 7/16 | 0.4 | −3.5 | 1 | 3.5 |
| 10 | 6 | 0 | 6 | 10 | 0 | 10 |  | 6/16 | 0.4 | −3.0 | 1 | 3.0 |
| 11 | 5 | 0 | 5 | 11 | 0 | 11 |  | 5/16 | 0.3 | −2.5 | 1 | 2.5 |
| 12 | 4 | 0 | 4 | 12 | 0 | 12 |  | 4/16 | 0.3 | −2.0 | 1 | 2.0 |
| 13 | 3 | 0 | 3 | 13 | 0 | 13 |  | 3/16 | 0.2 | −1.5 | 1 | 1.5 |
| 14 | 2 | 0 | 2 | 14 | 0 | 14 |  | 2/16 | 0.1 | −1.0 | 1 | 1.0 |
| 15 | 1 | 0 | 1 | 15 | 0 | 15 |  | 1/16 | 0.1 | −0.5 | 1 | 0.5 |
| 16 | 0 | 0 | 0 | 16 | 0 | 16 |  | 0/16 | 0.0 | 0.0 | 0 | 0.0 |
| 17 | −1 | 1 | 1 | 15 | 0 | 15 |  | −1/16 | −0.1 | 0.5 | 0 | 0.5 |
| 18 | −2 | 1 | 2 | 14 | 0 | 14 |  | −2/16 | −0.2 | 1.0 | 0 | 1.0 |
| 19 | −3 | 1 | 3 | 13 | 0 | 13 |  | −3/16 | −0.3 | 1.5 | 0 | 1.5 |
| 20 | −4 | 1 | 4 | 12 | 0 | 12 |  | −4/16 | −0.3 | 2.0 | 0 | 2.0 |
| 21 | −5 | 1 | 5 | 11 | 0 | 11 |  | −5/16 | −0.4 | 2.5 | 0 | 2.5 |
| 22 | −6 | 1 | 6 | 10 | 0 | 10 |  | −6/16 | −0.4 | 3.0 | 0 | 3.0 |
| 23 | −7 | 1 | 7 | 9 | 0 | 9 |  | −7/16 | −0.5 | 3.5 | 0 | 3.5 |
| 24 | −8 | 1 | 8 | 8 | 0 | 8 |  | −8/16 | −0.5 | 4.0 | 0 | 4.0 |
| 25 | −9 | 1 | 9 | 7 | 0 | 7 |  | −9/16 | −0.6 | 4.5 | 0 | 4.5 |
| 26 | −10 | 1 | 10 | 6 | 0 | 6 |  | −10/16 | −0.6 | 5.0 | 0 | 5.0 |
| 27 | −11 | 1 | 11 | 5 | 0 | 5 |  | −11/16 | −0.7 | 5.5 | 0 | 5.5 |
| 28 | −12 | 1 | 12 | 4 | 0 | 4 |  | −12/16 | −0.8 | 6.0 | 0 | 6.0 |
| 29 | −13 | 1 | 13 | 3 | 0 | 3 |  | −13/16 | −0.8 | 6.5 | 0 | 6.5 |
| 30 | −14 | 1 | 14 | 2 | 0 | 2 |  | −14/16 | −0.9 | 7.0 | 0 | 7.0 |
| 31 | −15 | 1 | 15 | 1 | 0 | 1 |  | −15/16 | −0.9 | 7.5 | 0 | 7.5 |
| 32 | −16 | 1 | 16 | 0 | 0 | 0 |  | −16/16 | −1.0 | 8.0 | 0 | 8.0 |

F I G. 12A
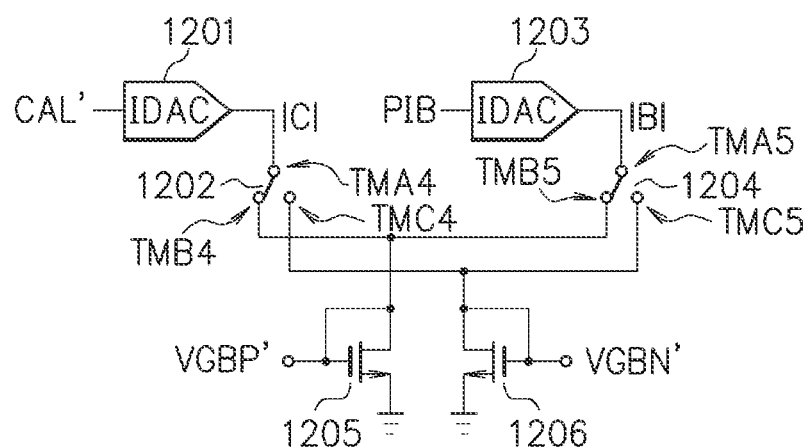
F I G. 12B
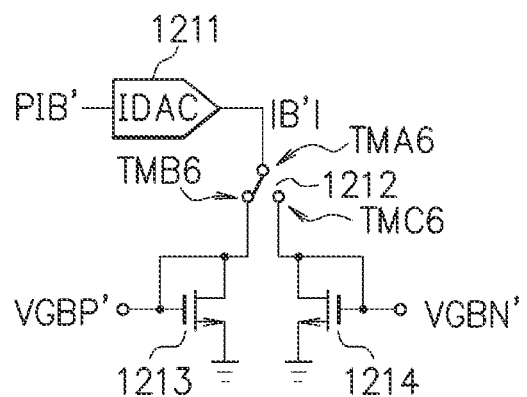

FIG. 12C

| Q CURRNT:PIB | | | CORRECTION C0 | CURRENT MIRROR | | Q CORRECTION CURRENT:CAL' | | | Q CORRECTION CURRENT:PIB' | | |
|---|---|---|---|---|---|---|---|---|---|---|---|
| code | sign | \|B\| | code | ratio ∞ code | A | code | sign | \|C\| | code | sign | \|B'\| |
| 0 | 0 | 0 | −8 | 16/16 | 1.0 | −8.0 | 1 | 8.0 | −8.0 | 1 | 8.0 |
| 1 | 0 | 1 | | 15/16 | 0.9 | −7.5 | 1 | 7.5 | −6.5 | 1 | 6.5 |
| 2 | 0 | 2 | | 14/16 | 0.9 | −7.0 | 1 | 7.0 | −5.0 | 1 | 5 |
| 3 | 0 | 3 | | 13/16 | 0.8 | −6.5 | 1 | 6.5 | −3.5 | 1 | 3.5 |
| 4 | 0 | 4 | | 12/16 | 0.8 | −6.0 | 1 | 6.0 | −2.0 | 1 | 2 |
| 5 | 0 | 5 | | 11/16 | 0.7 | −5.5 | 1 | 5.5 | −0.5 | 1 | 0.5 |
| 6 | 0 | 6 | | 10/16 | 0.6 | −5.0 | 1 | 5.0 | 1.0 | 0 | 1 |
| 7 | 0 | 7 | | 9/16 | 0.6 | −4.5 | 1 | 4.5 | 2.5 | 0 | 2.5 |
| 8 | 0 | 8 | | 8/16 | 0.5 | −4.0 | 1 | 4.0 | 4.0 | 0 | 4 |
| 9 | 0 | 9 | | 7/16 | 0.4 | −3.5 | 1 | 3.5 | 5.5 | 0 | 5.5 |
| 10 | 0 | 10 | | 6/16 | 0.4 | −3.0 | 1 | 3.0 | 7.0 | 0 | 7 |
| 11 | 0 | 11 | | 5/16 | 0.3 | −2.5 | 1 | 2.5 | 8.5 | 0 | 8.5 |
| 12 | 0 | 12 | | 4/16 | 0.3 | −2.0 | 1 | 2.0 | 10.0 | 0 | 10 |
| 13 | 0 | 13 | | 3/16 | 0.2 | −1.5 | 1 | 1.5 | 11.5 | 0 | 11.5 |
| 14 | 0 | 14 | | 2/16 | 0.1 | −1.0 | 1 | 1.0 | 13.0 | 0 | 13 |
| 15 | 0 | 15 | | 1/16 | 0.1 | −0.5 | 1 | 0.5 | 14.5 | 0 | 14.5 |
| 16 | 0 | 16 | | 0/16 | 0.0 | 0.0 | 0 | 0.0 | 16.0 | 0 | 16 |
| 15 | 0 | 15 | | −1/16 | −0.1 | 0.5 | 0 | 0.5 | 15.5 | 0 | 15.5 |
| 14 | 0 | 14 | | −2/16 | −0.2 | 1.0 | 0 | 1.0 | 15.0 | 0 | 15 |
| 13 | 0 | 13 | | −3/16 | −0.3 | 1.5 | 0 | 1.5 | 14.5 | 0 | 14.5 |
| 12 | 0 | 12 | | −4/16 | −0.3 | 2.0 | 0 | 2.0 | 14.0 | 0 | 14 |
| 11 | 0 | 11 | | −5/16 | −0.4 | 2.5 | 0 | 2.5 | 13.5 | 0 | 13.5 |
| 10 | 0 | 10 | | −6/16 | −0.4 | 3.0 | 0 | 3.0 | 13.0 | 0 | 13 |
| 9 | 0 | 9 | | −7/16 | −0.5 | 3.5 | 0 | 3.5 | 12.5 | 0 | 12.5 |
| 8 | 0 | 8 | | −8/16 | −0.5 | 4.0 | 0 | 4.0 | 12.0 | 0 | 12 |
| 7 | 0 | 7 | | −9/16 | −0.6 | 4.5 | 0 | 4.5 | 11.5 | 0 | 11.5 |
| 6 | 0 | 6 | | −10/16 | −0.6 | 5.0 | 0 | 5.0 | 11.0 | 0 | 11 |
| 5 | 0 | 5 | | −11/16 | −0.7 | 5.5 | 0 | 5.5 | 10.5 | 0 | 10.5 |
| 4 | 0 | 4 | | −12/16 | −0.8 | 6.0 | 0 | 6.0 | 10.0 | 0 | 10 |
| 3 | 0 | 3 | | −13/16 | −0.8 | 6.5 | 0 | 6.5 | 9.5 | 0 | 9.5 |
| 2 | 0 | 2 | | −14/16 | −0.9 | 7.0 | 0 | 7.0 | 9.0 | 0 | 9 |
| 1 | 0 | 1 | | −15/16 | −0.9 | 7.5 | 0 | 7.5 | 8.5 | 0 | 8.5 |
| 0 | 0 | 0 | | −16/16 | −1.0 | 8.0 | 0 | 8.0 | 8.0 | 0 | 8 |

PHASE INTERPOLATOR CIRCUIT, RECEPTION CIRCUIT, AND SEMICONDUCTOR INTEGRATED CIRCUIT

CROSS-REFERENCE TO RELATED APPLICATION

This application is a continuation application of International Application PCT/JP2021/003969 filed on Feb. 3, 2021, and designated the U.S., the entire contents of which are incorporated herein by reference.

FIELD

The embodiments discussed herein are directed to a phase interpolator circuit, a reception circuit, and a semiconductor integrated circuit.

BACKGROUND

A reception circuit of a deserializer in a Serializer/Deserializer (SerDes) acquires data from a high-frequency reception signal based on a clock signal. There is a phase interpolator (PI) circuit that generates an output clock signal having a desired phase from a plurality of input clock signals in order to adjust the phase of the clock signal so as to be able to properly acquire the data from the reception signal. The phase interpolator circuit is used as a phase adjustment circuit for a clock data recovery (CDR) circuit in the reception circuit.

In the reception circuit of the deserializer, for example, as illustrated in FIG. 16, a comparator 1604 acquires data signal DT from a reception signal DTIN using a first output clock signal ICKO output from a phase interpolator circuit 1601, and a comparator 1605 acquires a boundary signal BD from the reception signal DTIN using a second output clock signal QCKO output from the phase interpolator circuit 1601. The first output clock signal ICKO and the second output clock signal QCKO have a certain phase difference (approximately 90 degrees).

The phase interpolator circuit 1601 generates the output clock signals ICKO and QCKO based on input clock signals ICKI and QCKI, respectively. Each of the output clock signals ICKO and QCKO have a phase according to an input phase interpolation (PI) code based on input clock signals ICKI and QCKI, respectively. The phase interpolator circuit 1601 includes a phase interpolator circuit 1602 that generates the first output clock signal ICKO and a phase interpolator circuit 1603 that generates the second output clock signal QCKO. The phase interpolator circuits 1602 and 1603 generate the output clock signals ICKO and QCKO, respectively, by weighting and synthesizing the input clock signals ICKI and QCKI based on the PI code.

There are illustrated configuration examples of the conventional phase interpolator circuits 1602 and 1603 in FIG. 17 (see Patent Document 1, for example). Drains of transistors 1711, 1722, 1731, and 1742 are connected to a power supply VDD via a resistor 1701. The drains of the transistors 1711, 1722, 1731, and 1742 are connected to an output end OUTP. Drains of transistors 1712, 1721, 1732, and 1741 are connected to a power supply VDD via a resistor 1702. The drains of the transistors 1712, 1721, 1732, and 1741 are connected to an output end OUTN.

An input clock signal ICKIP is input to gates of the transistors 1711 and 1721, and an input clock signal ICKIN having a phase opposite to that of the input clock signal ICKIP is input to gates of the transistors 1712 and 1722. An input clock signal QCKIP having a certain phase difference from the input clock signal ICKIP is input to gates of the transistors 1731 and 1741, and an input clock signal QCKIN having a phase opposite to that of the input clock signal QCKIP is input to gates of the transistors 1732 and 1742. The input clock signals ICKIP and ICKIN are equivalent to the input clock signal ICKI illustrated in FIG. 16, and the input clock signals QCKIP and QCKIN are equivalent to the input clock signal QCKI illustrated in FIG. 16.

A drain of a transistor 1713 is connected to sources of the transistors 1711 and 1712, and a drain of a transistor 1723 is connected to sources of the transistors 1721 and 1722. A drain of a transistor 1733 is connected to sources of the transistors 1731 and 1732, and a drain of a transistor 1743 is connected to sources of the transistors 1741 and 1742. Sources of the transistors 1713, 1723, 1733, and 1743 are grounded.

Gate voltages VGAP and VGAN are applied to gates of the transistors 1713 and 1723 according to the PI code, and gate voltages VGBP and VGBN are applied to gates of the transistors 1733 and 1743 according to the PI code. The transistors 1713, 1723, 1733, and 1743 serve as a current source that supplies current to the corresponding transistor according to the PI code. According to the PI code, either one of the transistors 1713 and 1723 and either one of the transistors 1733 and 1743 are driven by a voltage according to the PI code, and thereby, one of the input clock signals ICKIP and ICKIN and one of the input clock signals QCKIP and QCKIN are weighted and synthesized to generate an output clock signal.

If there is a phase difference shift (skew mismatch) between the input clock signal ICKI and the input clock signal QCKI that are input to the phase interpolator circuit 1601, a phase difference shift also occurs between the output clock signal ICKO and the output clock signal QCKO to be output from the phase interpolator circuit 1601. The respective phases of the output clock signals ICKO and QCKO preferably vary linearly according to the PI code and have a constant phase difference regardless of the PI code, as indicated by the dashed lines illustrated in FIG. 18 as an example, but they vary as indicated by solid lines 1801 and 1802, resulting in that a phase difference shift occurs according to the PI code. When the phase difference between the output clock signal ICKO and the output clock signal QCKO varies according to the PI code as above, the timing margin of a circuit using the output clock signals ICKO and QCKO is reduced, which hinders high-speed operations.

As a method to avoid this problem, as illustrated in FIG. 19, there is a method in which an input clock correction circuit 1901 having the same function as the phase interpolator circuit 1601 is provided in front the phase interpolator circuit 1601, and internal circuits 1902 and 1903 in the input clock correction circuit 1901 generate clock signals with the phase difference shift corrected based on the input clock signals ICKI and QCKI, and input the generated clock signals to the phase interpolator circuit 1601. This method needs to add a circuit that transmits high-frequency signals.

[Patent Document 1] Japanese Laid-open Patent Publication No. 2014-146869

[Patent Document 2] Japanese Laid-open Patent Publication No. 2016-219916

[Patent Document 3] U.S. Patent Application Publication No. 2016/0182216

SUMMARY

One aspect of the phase interpolator circuit includes: a first generation circuit configured to generate a first intermediate current based on a first input clock signal according to a phase interpolation code; a second generation circuit configured to generate a second intermediate current based on a second input clock signal having a first phase difference from the first input clock signal according to the phase interpolation code; a synthesis circuit configured to synthesize the first intermediate current and the second intermediate current to generate an output clock signal; and a correction circuit configured to correct a current amount of at least one of the first intermediate current and the second intermediate current based on a correction current according to a correction code set according to at least an amount of shift of the first phase difference from a certain value.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 is a view explaining control examples of the phase interpolator circuit in the first embodiment;

FIG. 12A is a diagram illustrating a configuration example of a gate voltage control circuit of a phase interpolator circuit in a third embodiment;

FIG. 12B is a diagram illustrating a configuration example of a gate voltage control circuit of the phase interpolator circuit in the third embodiment;

FIG. 12C is a view explaining control examples of the gate voltage control circuit of the phase interpolator circuit in the third embodiment;

DESCRIPTION OF EMBODIMENTS

There will be explained embodiments based on the drawings below.

First Embodiment

There is explained a first embodiment.

Figure 1:
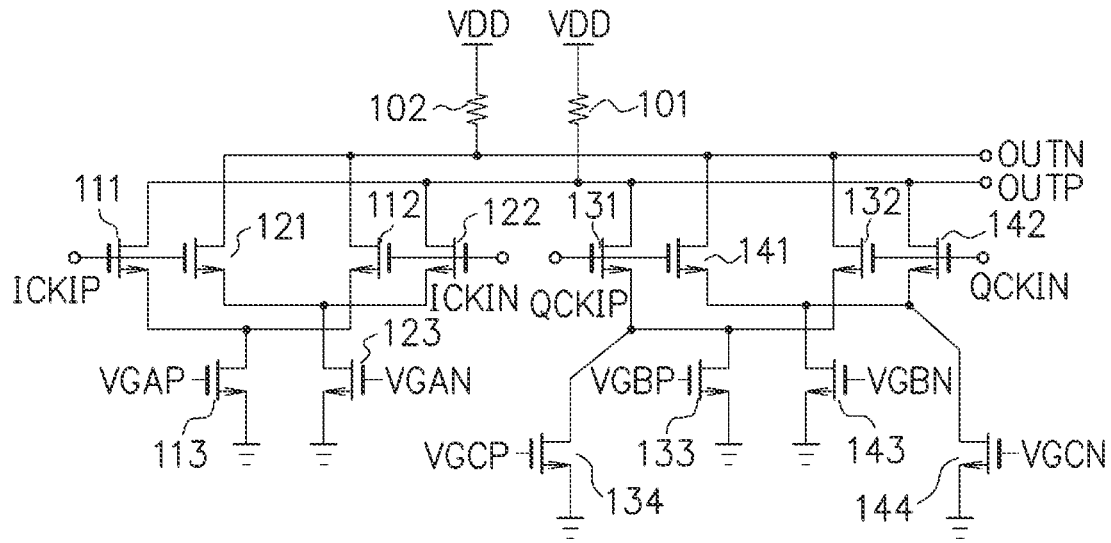
FIG. 1 is a diagram illustrating a configuration example of a phase interpolator circuit in a first embodiment.

FIG. 1 is a diagram illustrating a configuration example of a phase interpolator circuit in the first embodiment. The phase interpolator circuit in the first embodiment includes resistors 101 and 102, and transistors 111 to 113, 121 to 123, 131 to 134, and 141 to 144. The transistors 111 to 113, 121 to 123, 131 to 134, and 141 to 144 each are an N-type MOSFET (Metal Oxide Semiconductor Field Effect Transistor), for example.

Drains of the transistors 111, 122, 131, and 142 are connected to a power supply VDD via the resistor 101, which is a load. The connection points between the drains of the transistors 111, 122, 131, and 142 and the resistor 101 are connected to an output end OUTP. Drains of the transistors 112, 121, 132, and 141 are connected to a power supply VDD via the resistor 102, which is a load. The connection points between the drains of the transistors 112, 121, 132, and 141 and the resistor 102 are connected to an output end OUTN.

An input clock signal ICKIP is input to a gate of the transistor 111, and an input clock signal ICKIN having a phase opposite to that of the input clock signal ICKIP is input to a gate of the transistor 112. A source of the transistor 111 and a source of the transistor 112 are commonly connected to a drain of the transistor 113. A source of the transistor 113 is grounded. A gate voltage VGAP is applied to a gate of the transistor 113 according to a phase interpolation (PI) code. The transistor 113 serves as a current source that supplies current to the transistors 111 and 112 according to the PI code.

The input clock signal ICKIP is input to a gate of the transistor 121 and the input clock signal ICKIN is input to a gate of the transistor 122. A source of the transistor 121 and a source of the transistor 122 are commonly connected to a drain of the transistor 123. A source of the transistor 123 is grounded. A gate voltage VGAN is applied to a gate of the transistor 123 according to the PI code. The transistor 123 serves as a current source that supplies current to the transistors 121 and 122 according to the PI code.

In the example illustrated in FIG. 1, the transistors 111, 112, 121, and 122 and the transistors 113 and 123 are examples of a first generation circuit that generates a first intermediate current for the connection points with the resistors 101 and 102 based on the first input clock signals ICKIP and ICKIN according to the PI code.

An input clock signal QCKIP having a certain phase difference from the input clock signal ICKIP is input to a gate of the transistor 131, and an input clock signal QCKIN having a phase opposite to that of the input clock signal QCKIP is input to a gate of the transistor 132. A source of the transistor 131 and a source of the transistor 132 are commonly connected to a drain of the transistor 133 and a drain of the transistor 134. A source of the transistor 133 and a source of the transistor 134 are grounded. A gate voltage VGBP is applied to a gate of the transistor 133 according to the PI code, and a gate voltage VGCP is applied to a gate of the transistor 134 according to the PI code and a correction code. The transistor 133 serves as a current source that supplies current to the transistors 131 and 132 according to the PI code. The transistor 134 serves as a current source that supplies current to the transistors 131 and 132 according to the PI code and the correction code.

The input clock signal QCKIP is input to a gate of the transistor 141 and the input clock signal QCKIN is input to a gate of the transistor 142. A source of the transistor 141 and a source of the transistor 142 are commonly connected to a drain of the transistor 143 and a drain of the transistor 144. Sources of the transistor 143 and the transistor 144 are grounded. A gate voltage VGBN is applied to a gate of the transistor 143 according to the PI code, and a gate voltage VGCN is applied to a gate of the transistor 144 according to the PI code and the correction code. The transistor 143 serves as a current source that supplies current to the transistors 141 and 142 according to the PI code. The transistor 144 serves as a current source that supplies current to the transistors 141 and 142 according to the PI code and the correction code.

In the example illustrated in FIG. 1, the transistors 131, 132, 141, and 142 and the transistors 133 and 143 are examples of a second generation circuit that generates a second intermediate current for the connection points with the resistors 101 and 102 based on the second input clock signals QCKIP and QCKIN according to the PI code.

In the example illustrated in FIG. 1, the resistor 101 and the connection points between the drains of the transistors 111, 122, 131, and 142 and the resistor 101, and the resistor 102 and the connection points between the drains of the transistors 112, 121, 132, and 141 and the resistor 102 are examples of a synthesis circuit that synthesizes the first intermediate current and the second intermediate current described above and generates an output clock signal at the output ends OUTP and OUTN.

In the example illustrated in FIG. 1, the transistors (134 and 144), which serve as a current source that supplies current according to the correction code, are provided on the side of the transistors 133 and 143, which serve as a current source that supplies current according to the PI code (the side of the second intermediate current). However, alternatively, the transistors (134 and 144) may be provided on the side of the transistors 113 and 123, which similarly function as a current source that supplies current according to the PI code (the side of the first intermediate current), or can be provided on the both sides.

Figure 2A:
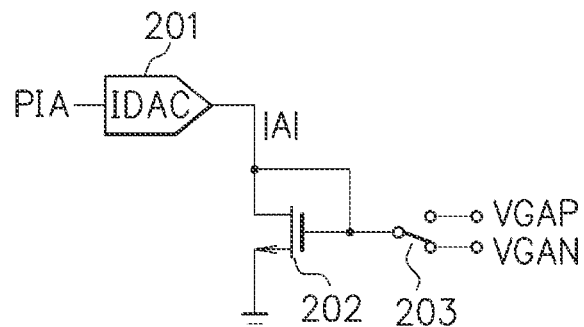
FIG. 2A is a diagram illustrating a configuration example of a gate voltage control circuit of the phase interpolator circuit in the first embodiment.

FIG. 2A is a diagram illustrating a configuration example of a gate voltage control circuit that controls the gate voltages VGAP and VGAN to be applied to the gates of the transistors 113 and 123 illustrated in FIG. 1. As illustrated in FIG. 2A, the (digital analog converter) 201, a transistor 202, and a switch 203.

The current DAC 201 outputs the current according to the absolute value of a code value of a current control code PIA to be input. The current control code PIA is set based on the PI code for the phase interpolator circuit and is a code for controlling the current flowing in the transistors 113 and 123, which serve as a current source relating to the input clock signals ICKIP and ICKIN, in response to the PI code. The transistor 202 is diode-connected between an output end of the current DAC 201 and ground. That is, the output end of the current DAC 201 is connected to a drain and a gate of the transistor 202, and a source of the transistor 202 is grounded.

The switch 203 is connected to the gate of the transistor 202 and outputs the voltage generated by inputting the output current of the current DAC 201 to the diode-connected transistor 202 as the gate voltage VGAP or VGAN according to the sign of the current control code PIA. When the current control code PIA is positive, the switch 203 outputs the voltage according to the current control code PIA generated by the current DAC 201 and the diode-connected transistor 202 to the gate of the transistor 113 as the gate voltage VGAP. When the current control code PIA is negative, the switch 203 outputs the voltage according to the current control code PIA generated by the current DAC 201 and the diode-connected transistor 202 to the gate of the transistor 123 as the gate voltage VGAN.

Figure 2B:
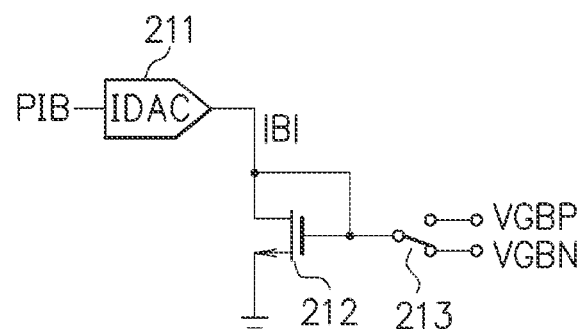
FIG. 2B is a diagram illustrating a configuration example of a gate voltage control circuit of the phase interpolator circuit in the first embodiment.

FIG. 2B is a diagram illustrating a configuration example of a gate voltage control circuit that controls the gate voltages VGBP and VGBN to be applied to the gates of the transistors 133 and 143 illustrated in FIG. 1. As illustrated in FIG. 2B, the gate voltage control circuit includes a current DAC 211, a transistor 212, and a switch 213.

The current DAC 211 outputs the current according to the absolute value of a code value of a current control code PIB to be input. The current control code PIB is set based on the PI code for the phase interpolator circuit and is a code for controlling the current flowing in the transistors 133 and 143, which serve as a current source relating to the input clock signals QCKIP and QCKIN, in response to the PI code. The transistor 212 is diode-connected between an output end of the current DAC 211 and ground. That is, the output end of the current DAC 211 is connected to a drain and a gate of the transistor 212, and a source of the transistor 212 is grounded.

The switch 213 is connected to the gate of the transistor 212 and outputs the voltage generated by inputting the output current of the current DAC 211 to the diode-connected transistor 212 as the gate voltage VGBP or VGBN according to the sign of the current control code PIB. When the current control code PIB is positive, the switch 213 outputs the voltage according to the current control code PIB generated by the current DAC 211 and the diode-connected transistor 212 to the gate of the transistor 133 as the gate voltage VGBP. When the current control code PIB is negative, the switch 213 outputs the voltage according to the current control code PIB generated by the current DAC 211 and the diode-connected transistor 212 to the gate of the transistor 143 as the gate voltage VGBN.

In this description, there is explained an example where the current control code PIA and the current control code PIB are integer values in the range of (−16) to (+16). In this case, as the output phase of the clock signal, a phase control within a range of 180 degrees is possible with 32 codes in the PI code, and a phase control within a range of 360 degrees is possible with 64 codes in the PI code. Incidentally, this is one example, and the embodiment is not limited to this. The number of PI codes (current control code PIA and current control code PIB) is arbitrary, and increasing the number of codes allows finer phase control.

Figure 2C:
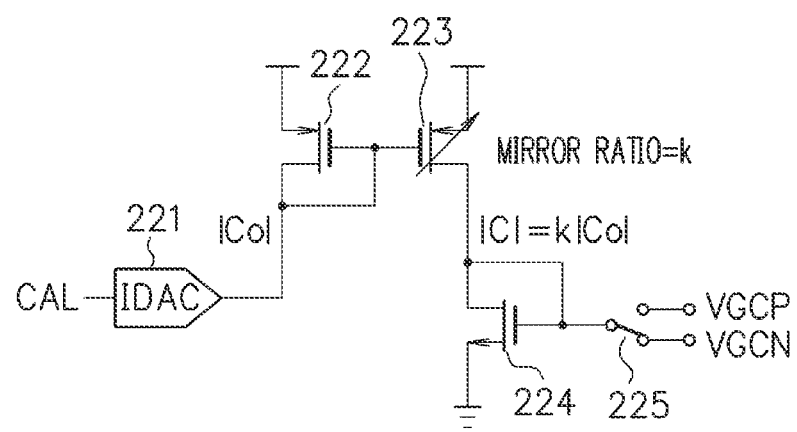
FIG. 2C is a diagram illustrating a configuration example of a gate voltage control circuit of the phase interpolator circuit in the first embodiment.

FIG. 2C is a diagram illustrating a configuration example of a gate voltage control circuit that controls the gate voltages VGCP and VGCN to be applied to the gates of the transistors 134 and 144 illustrated in FIG. 1. As illustrated in FIG. 2C, the 221, transistors 222, 223, and 224, and a switch 225.

The current DAC 221 outputs the current according to the absolute value of a code value of a correction code CAL to be input. The correction code CAL is a code relating to a correction current that is supplied to reduce the phase error of the output clock signal. The transistor 222 has a source thereof connected to the power supply VDD, and has a drain and a gate thereof connected to an output end of the current DAC 221. The transistor 223 has a source thereof connected to the power supply VDD and has a gate thereof connected to the gate of the transistor 222. The transistor 222 and the transistor 223 form a current mirror circuit. A mirror ratio k of the current mirror circuit formed of the transistor 222 and the transistor 223 is variable, and is controlled to vary in proportion to the current control code PIA. Therefore, from a drain of the transistor 223, a current (|C|) according to the current control code PIA, which is k times an output current (|C0|) of the current DAC 221 according to the correction code CAL, is output.

The transistor 224 is diode-connected between the drain of the transistor 223 and ground. That is, the drain of the transistor 223 is connected to a drain and a gate of the transistor 224, and a source of the transistor 224 is grounded.

The switch 225 is connected to the gate of the transistor 224 and outputs the voltage generated by inputting the current, which is k times the output current of the current DAC 211, to the diode-connected transistor 224 as the gate voltage VGCP or VGCN according to the sign of a product value of the correction code CAL and the current control code PIA. When the product value of the correction code CAL and the current control code PIA is positive, the switch 225 outputs the voltage according to the correction code CAL and the current control code PIA generated by the diode-connected transistor 224 to the gate of the transistor 134 as the gate voltage VGCP. When the product value of the correction code CAL and the current control code PIA is negative, the switch 225 outputs the voltage according to the correction code CAL and the current control code PIA generated by the diode-connected transistor 224 to the gate of the transistor 144 as the gate voltage VGCN.

In the example illustrated in FIG. 1, the transistors 134 and 144 and the gate voltage control circuit illustrated in FIG. 2C are examples of a correction circuit that corrects a current amount of at least one of the first intermediate current and the second intermediate current based on the correction current according to the correction code.

Figure 3A:
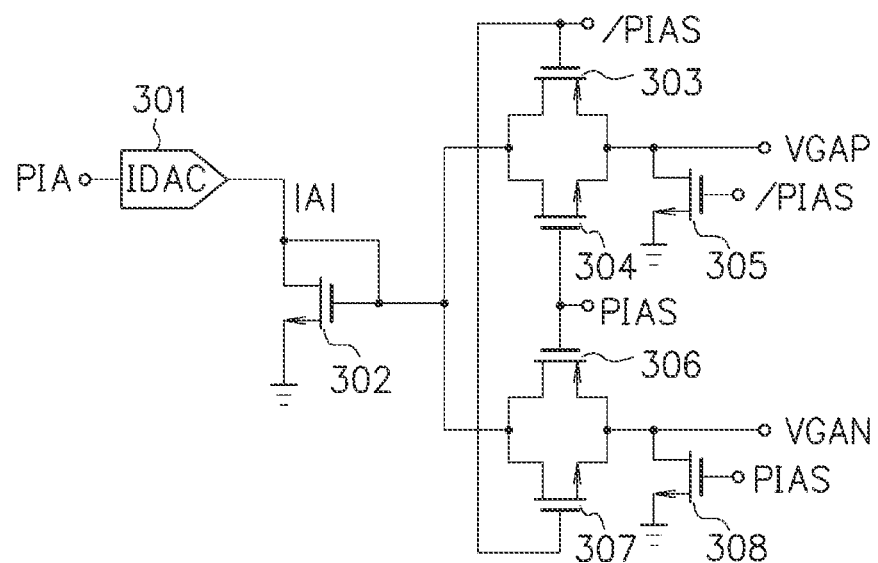
FIG. 3A is a diagram illustrating a circuit configuration example of the gate voltage control circuit illustrated in FIG. 2A.

FIG. 3A is a diagram illustrating a circuit configuration example of the gate voltage control circuit illustrated in FIG. 2A. An output end of a current DAC 301, which outputs the current according to the absolute value of a code value of the current control code PIA to be input, is connected to a drain and a gate of a transistor 302. A source of the transistor 302 is grounded. The gate of the transistor 302 is connected to the output end of the gate voltage VGAP via a transfer gate formed of transistors 303 and 304. The connection point between the transfer gate formed of the transistors 303 and 304 and the output end of the gate voltage VGAP is grounded via a transistor 305. Further, the gate of the transistor 302 is connected to the output end of the gate voltage VGAN via a transfer gate formed of transistors 306 and 307. The connection point between the transfer gate formed of the transistors 306 and 307 and the output end of the gate voltage VGAN is grounded via a transistor 308.

The transfer gate formed of the transistors 303 and 304, the transistor 305, the transfer gate formed of the transistors 306 and 307, and the transistor 308 are switch-controlled between a continuity state and a non-continuity state by a signal PIAS and its inverted signal/PIAS. The signal PIAS is a signal indicating the sign of the current control code PIA. When the current control code PIA is positive, the signal PIAS goes to a high level (the inverted signal/PIAS goes to a low level). When the current control code PIA is negative, the signal PIAS goes to a low level (the inverted signal/PIAS goes to a high level).

When the signal PIAS is a high level (the inverted signal/PIAS is a low level), that is, when the current control code PIA is positive, the transfer gate formed of the transistors 303 and 304 and the transistor 308 are in a continuity state (on state) and the transistor 305 and the transfer gate formed of the transistors 306 and 307 are in a non-continuity state (off state). Therefore, when the sign of the current control code PIA is positive, the voltage according to the current control code PIA is output as the gate voltage VGAP, and the gate voltage VGAN becomes a ground potential.

When the signal PIAS is a low level (the inverted signal/PIAS is a high level), that is, when the current control code PIA is negative, the transistor 305 and the transfer gate formed of the transistors 306 and 307 are in a continuity state (on state) and the transfer gate formed of the transistors 303 and 304 and the transistor 308 are in a non-continuity state (off state). Therefore, when the sign of the current control code PIA is negative, the voltage according to the current control code PIA is output as the gate voltage VGAN, and the gate voltage VGAP becomes a ground potential.

Incidentally, the gate voltage control circuit illustrated in FIG. 2B is configured similarly.

Figure 3B:
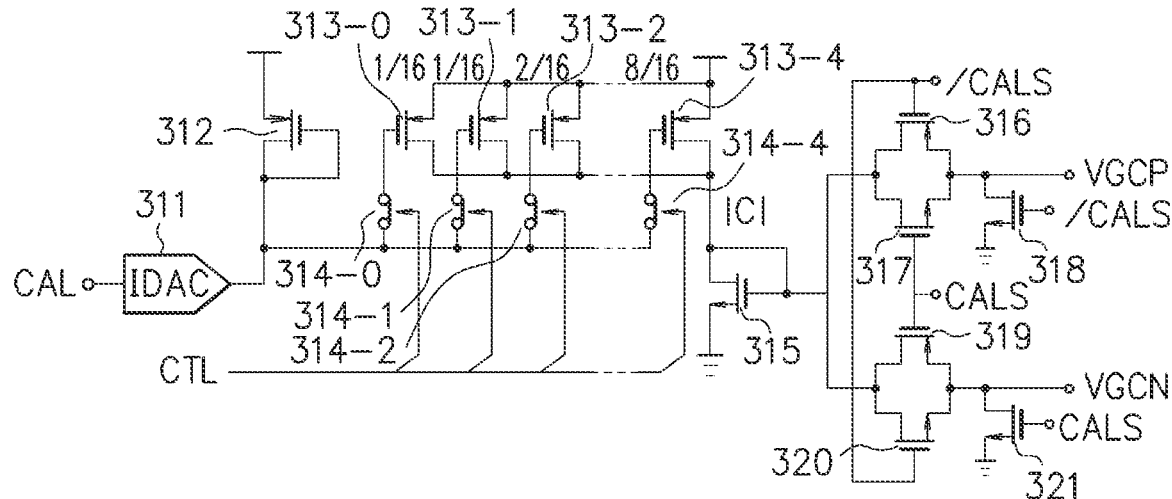
FIG. 3B is a diagram illustrating a circuit configuration example of the gate voltage control circuit illustrated in FIG. 2C.

FIG. 3B is a diagram illustrating a circuit configuration example of the gate voltage control circuit illustrated in FIG. 2C. An output end of a current DAC 311, which outputs the current according to the absolute value of a code value of the correction code CAL to be input, is connected to a drain and a gate of a transistor 312. A source of the transistor 312 is connected to the power supply VDD. Transistors 313-$i$, (where $i$ is a subscript and is an integer of 0 to 4, and the same applies hereinafter), have sources thereof connected to the power supply VDD and have gates thereof connected to the gate of the transistor 312 via switches 314-*i*. If the respective corresponding switches 314-*i* are in a continuity state (on state), the transistors 313-0 and 313-1 are configured so that (1/16) times the mirror current flows, and the transistor 313-2 is configured so that (2/16) times the mirror current flows. Similarly, the transistor 313-3 is configured so that (4/16) times the mirror current flows, and the transistor 313-4 is configured so that (8/16) times the mirror current flows. The switch 314-*i* is on/off controlled by a control signal CTL based on the current control code PIA so that the mirror ratio of a current mirror circuit formed of the transistor 312 and the transistor 313-*i* varies in proportion to the current control code PIA.

A drain of the transistor 313-*i* is connected to a drain and a gate of a transistor 315. A source of the transistor 315 is grounded. The gate of the transistor 315 is connected to an output end of the gate voltage VGCP via a transfer gate formed of transistors 316 and 317. The connection point between the transfer gate formed of the transistors 316 and 317 and the output end of the gate voltage VGCP is grounded via a transistor 318. Further, the gate of the transistor 315 is connected to an output end of the gate voltage VGCN via a transfer gate formed of transistors 319 and 320. The connection point between the transfer gate formed of the transistors 319 and 320 and the output end of the gate voltage VGCN is grounded via a transistor 321.

The transfer gate formed of the transistors 316 and 317, the transistor 318, the transfer gate formed of the transistors 319 and 320, and the transistor 321 are switch-controlled between a continuity state and a non-continuity state by a signal CALS and its inverted signal/CALS. The signal CALS is a signal indicating the sign of the product value of the correction code CAL and the current control code PIA. When the product value of the correction code CAL and the current control code PIA is positive, the signal CALS goes to a high level (the inverted signal /CALS goes to a low level). When the product value of the correction code CAL and the current control code PIA is negative, the signal CALS goes to a low level (the inverted signal/CALS goes to a high level).

When the signal CALS is a high level (the inverted signal/CALS is a low level), that is, when the product value of the correction code CAL and the current control code PIA is positive, the transfer gate formed of the transistors 316 and 317 and the transistor 321 are in a continuity state (on state) and the transistor 318 and the transfer gate formed of the transistors 319 and 320 are in a non-continuity state (off state). Therefore, when the sign of the product value of the correction code CAL and the current control code PIA is positive, the voltage according to the correction code CAL and the current control code PIA is output as the gate voltage VGCP, and the gate voltage VGCN becomes a ground potential.

When the signal CALS is a low level (the inverted signal/CALS is a high level), that is, when the product value of the correction code CAL and the current control code PIA is negative, the transistor 318 and the transfer gate formed of the transistors 319 and 320 are in a continuity state (on state) and the transfer gate formed of the transistors 316 and 317 and the transistor 321 are in a non-continuity state (off state). Therefore, when the sign of the product value of the correction code CAL and the current control code PIA is negative, the voltage according to the correction code CAL and the current control code PIA is output as the gate voltage VGCN, and the gate voltage VGCP becomes a ground potential.

Next, there is explained the operation of the phase interpolator circuit in this embodiment. The current DACs 201 and 211 in the gate voltage control circuits illustrated in FIG. 2A and FIG. 2B output currents having the absolute values of currents I_A and I_B indicated by solid lines 401 and 402 in FIG. 4A, respectively, according to the PI code. For convenience of explanation, the current DACs 201 and 211 are set to output a current that has a relative value, indicating a current ratio, of 16 when the absolute values of the current control codes PIA and PIB to be input are maximum (16), and are set to output a current that has a relative value, indicating a current ratio, of 0 when the absolute values of the current control codes PIA and PIB to be input are minimum (0) (no output current).

The current output from the current DAC 201 is converted into a voltage by the diode-connected transistor 202, and the converted voltage is supplied to one gate of the transistors 113 and 123, which serve as a current source, according to the sign of the current control code PIA. Similarly, the current output from the current DAC 211 is converted into a voltage by the diode-connected transistor 212, and the converted voltage is supplied to one gate of the transistors 133 and 143, which serve as a current source, according to the sign of the current control code PIB.

When the PI code is 8 (output phase of 45 degrees), for example, the current control code PIA is (+8), so that the current DAC 201 in the gate voltage control circuit illustrated in FIG. 2A outputs a current having a relative value of 8 according to the absolute value of 8 of the current control code PIA. Since the sign of the current control code PIA is positive, the voltage corresponding to the current having a relative value of 8 is supplied to the gate of the transistor 113 as the gate voltage VGAP. Further, when the PI code is 8, the current control code PIB is (+8), so that the current DAC 211 in the gate voltage control circuit illustrated in FIG. 2B outputs a current having a relative value of 8 according to the absolute value of 8 of the current control code PIB. Since the sign of the current control code PIB is positive, the voltage corresponding to the current having a relative value of 8 is supplied to the gate of the transistor 133 as the gate voltage VGBP. At this time, the ground potential is supplied to the gate of the transistor 123 as the gate voltage VGAN, and the ground potential is supplied to the gate of the transistor 143 as the gate voltage VGBN.

When the PI code is 16 (output phase of 90 degrees), for example, the current control code PIA is (0), so that the current DAC 201 in the gate voltage control circuit illustrated in FIG. 2A outputs a current having a relative value of 0 according to the absolute value of 0 of the current control code PIA (no output current), and the voltage corresponding to the current having a relative value of 0 (ground potential) is supplied to the gate of the transistor 113 as the gate voltage VGAP. Further, when the PI code is 16, the current control code PIB is (+16), so that the current DAC 211 in the gate voltage control circuit illustrated in FIG. 2B outputs a current having a relative value of 16 according to the absolute value of 16 of the current control code PIB. Since the sign of the current control code PIB is positive, the voltage corresponding to the current having a relative value of 16 is supplied to the gate of the transistor 133 as the gate voltage VGBP. At this time, the ground potential is supplied to the gate of the transistor 123 as the gate voltage VGAN, and the ground potential is supplied to the gate of the transistor 143 as the gate voltage VGBN.

When the PI code is 32 (output phase of 180 degrees), for example, the current control code PIA is (−16), so that the current DAC 201 in the gate voltage control circuit illustrated in FIG. 2A outputs a current having a relative value of 16 according to the absolute value of 16 of the current control code PIA. Since the sign of the current control code PIA is negative, the voltage corresponding to the current having a relative value of 16 is supplied to the gate of the transistor 123 as the gate voltage VGAN. Further, when the PI code is 32, the current control code PIB is 0, so that the current DAC 211 in the gate voltage control circuit illustrated in FIG. 2B outputs a current having a relative value of 0 according to the absolute value of 0 of the current control code PIB (no output current), and the voltage corresponding to the current having a relative value of 0 (ground potential) is supplied to the gate of the transistor 133 as the gate voltage VGBP. At this time, the ground potential is supplied to the gate of the transistor 113 as the gate voltage VGAP, and the ground potential is supplied to the gate of the transistor 143 as the gate voltage VGBN.

Accordingly, when the PI code is 0 to 16, that is, when the current control code PIA is positive and the current control code PIB is positive, the transistors 113 and 133 of the phase interpolator circuit operate as a current source that supplies current based on the PI code. As a result, the transistor 111 generates and outputs an intermediate current based on the input clock signal ICKIP, and the transistor 112 generates and outputs an intermediate current based on the input clock signal ICKIN. Further, the transistor 131 generates and outputs an intermediate current based on the input clock signal QCKIP, and the transistor 132 generates and outputs an intermediate current based on the input clock signal QCKIN. Then, the signal obtained by synthesizing the intermediate current output from the transistor 111 and the intermediate current output from the transistor 131 on a node is output from the output end OUTP as the output clock signal. Further, the signal obtained by synthesizing the intermediate current output from the transistor 112 and the intermediate current output from the transistor 132 on a node is output from the output end OUTN as the output clock signal (output signal having an opposite phase). In this way, the input clock signal ICKI (ICKIP, ICKIN) and the input clock signal QCKI (QCKIP, QCKIN) are weighted and synthesized according to the phase interpolation (PI) code, to generate the output clock signal.

Further, when the PI code is 17 to 32, that is, when the current control code PIA is negative and the current control code PIB is positive, the transistors 123 and 133 of the phase interpolator circuit operate as a current source that supplies current based on the PI code. As a result, the transistor 121 generates and outputs an intermediate current based on the input clock signal ICKIP, and the transistor 122 generates and outputs an intermediate current based on the input clock signal ICKIN. Further, the transistor 131 generates and outputs an intermediate current based on the input clock signal QCKIP, and the transistor 132 generates and outputs an intermediate current based on the input clock signal QCKIN. Then, the signal obtained by synthesizing the intermediate current output from the transistor 122 and the intermediate current output from the transistor 131 on a node is output from the output end OUTP as the output clock signal. Further, the signal obtained by synthesizing the intermediate current output from the transistor 121 and the intermediate current output from the transistor 132 on a node is output from the output end OUTN as the output clock signal (output clock signal having an opposite phase).

The same is true for the case where the PI code is 33 to 48 and 49 to 64. That is, when the PI code is 33 to 48, the current control code PIA is negative and the current control code PIB is negative, so that the transistors 123 and 143 of the phase interpolator circuit operate as a current source that supplies current based on the PI code and the output clock signal is generated in the same manner. Further, when the PI code is 49 to 64, the current control code PIA is positive and the current control code PIB is negative, so that the transistors 113 and 143 of the phase interpolator circuit operate as a current source that supplies current based on the PI code and the output clock signal is generated in the same manner.

Further, in the phase interpolator circuit in this embodiment, the phase difference between output clock signals (ICKO and QCKO) is adjusted to a certain phase difference (90 degrees) by supplying a correction current. In the phase interpolator circuit illustrated in FIG. 1, the transistors 134 and 144 serve as a current source that supplies a correction current. In this embodiment, as illustrated in FIG. 4B, the phase error of the output clock signal ICKO is measured based on the output clock signal QCKO, and the correction current is supplied so as to reduce the phase error, to correct the phase of the output clock signal ICKO, and thereby the phase difference between the output clock signals (ICKO and QCKO) is adjusted. The current amount of the correction current is adjusted in a manner that the PI code is set to a certain PI code and the phase of the output clock signal is measured, to thereby determine the correction code for supplying the correction current, and the mirror ratio of the current mirror circuit in the gate voltage control circuit is modified according to the current control code PIA set based on the PI code.

For example, when the determined correction code CAL is (−8), the current DAC 221 in the gate voltage control circuit illustrated in FIG. 2C outputs a current having a relative value of 8, which corresponds to the absolute value of 8 of the correction code CAL. Therefore, the current mirror circuit formed of the transistor 222 and the transistor 223 outputs a correction current I_Bcal indicated by a solid line 403 in FIG. 4A according to the PI code. The output correction current I_Bcal is converted into a voltage by the diode-connected transistor 224, and the converted voltage is supplied to the gate of one of the transistors 134 and 144, which serve as a current source, according to the sign of the product value of the correction code CAL and the current control code PIA.

As one example, when the PI code is 8, the current control code PIA is (+8), so that the gate voltage control circuit illustrated in FIG. 2C generates a current having a relative value of 4 (=8×8/16) obtained by multiplying the absolute value (8) of the correction code CAL by the ratio according to the current control code PIA, that is, the ratio between the present value (8) of the absolute value of the current control code PIA and its maximum value (16), and supplies the voltage corresponding to the generated current to the gate of the transistor 144 as the gate voltage VGCN because the sign of the product value of the correction code CAL and the current control code PIA is negative. When the PI code is 16, the current control code PIA is (0), so that the gate voltage control circuit illustrated in FIG. 2C supplies the voltage corresponding to the current having a relative value of 0 (=8×0/16) (ground potential) to the gate of the transistor 134 as the gate voltage VGCP. When the PI code is 32, the current control code PIA is (−16), so that the gate voltage control circuit illustrated in FIG. 2C generates a current having a relative value of 8 (=8×16/16) according to the ratio of the present value of the absolute value of the current control code PIA (16) to its maximum value (16), based on the absolute value (8) of the correction code CAL, for example, and supplies the voltage corresponding to the generated current to the gate of the transistor 134 as the gate voltage VGCP because the sign of the product value of the correction code CAL and the current control code PIA is positive.

Figure 6:
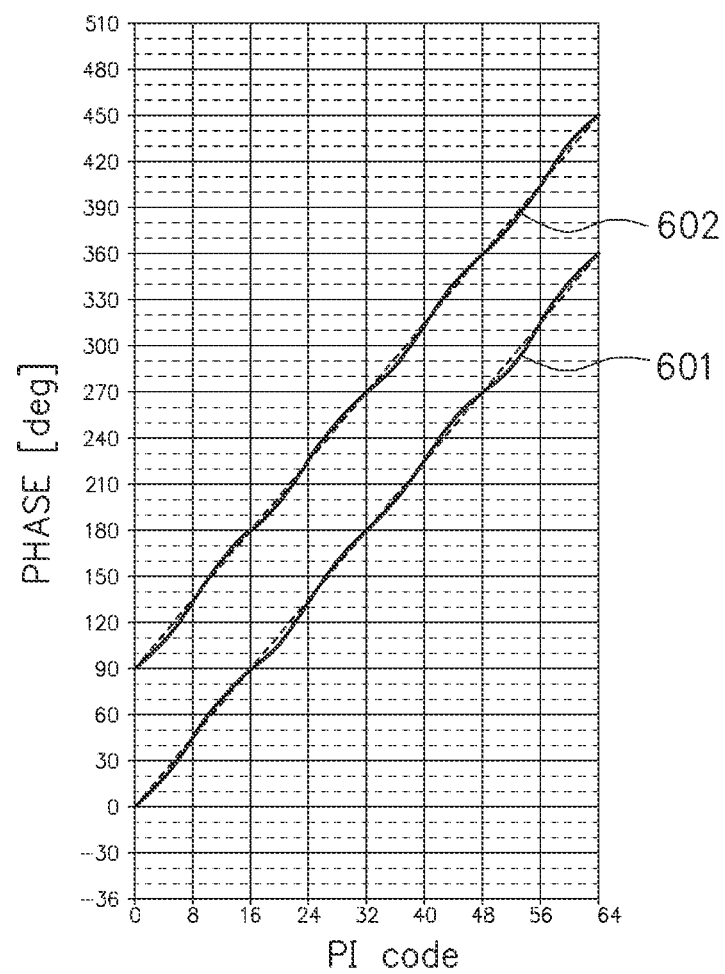
FIG. 6 is a view illustrating an example of output phases of the phase interpolator circuit in the first embodiment.

As above, in the phase interpolator circuit in this embodiment, controls are performed according to the PI code as illustrated in FIG. 5 as an example. As a result, the current amount of the intermediate currents output from the transistors 131, 132, 141, and 142 is corrected based on the correction current according to the correction code and the PI code, and the phase of the output clock signal obtained by synthesizing the intermediate currents is adjusted. In this manner, the phase interpolator circuit in this embodiment adjusts the phase difference between the output clock signals (ICKO and QCKO) to a certain phase difference (90 degrees). As a result, the respective phases of the output clock signals (ICKO and QCKO) vary as indicated by solid lines 601 and 602 in FIG. 6, for example, to thus make it possible to inhibit the phase difference shift in the output clock signals (ICKO and QCKO). Therefore, it is possible to prevent the timing margin of the circuit using the output clock signals (ICKO and QCKO) from becoming small and achieve high-speed operations.

Figure 7:
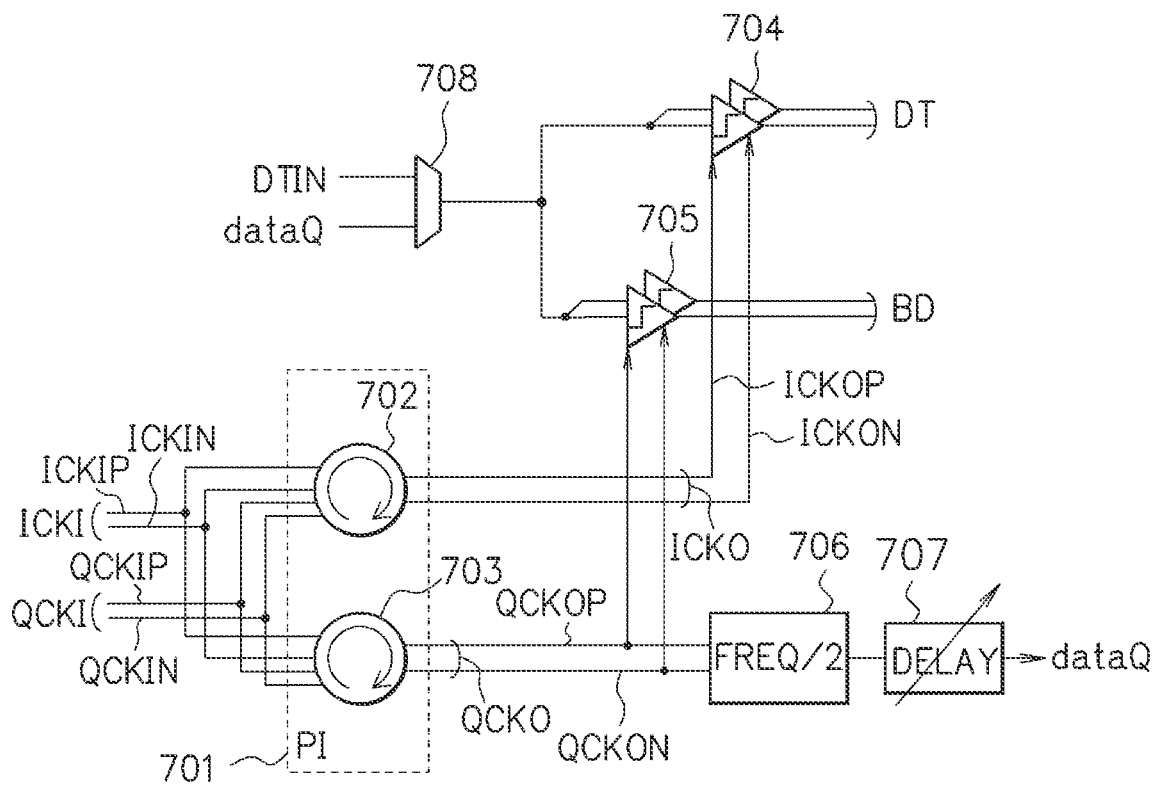
FIG. 7 is a diagram illustrating a configuration example of a phase interpolator circuit including a skew correction circuit in the first embodiment.

Next, there is explained a method of determining the correction code with reference to FIG. 7 to FIG. 9B. FIG. 7 is a diagram illustrating a configuration example of a phase interpolator circuit including a skew correction circuit in the first embodiment. In FIG. 7, a phase interpolator circuit 701 generates the output clock signals ICKO and QCKO each having a phase according to an input PI code to be input based on the input clock signals ICKI and QCKI, respectively. The phase interpolator circuit 701 includes a phase interpolator circuit 702 that generates the first output clock signal ICKO and a phase interpolator circuit 703 that generates the second output clock signal QCKO. The phase interpolator circuits 702 and 703 are configured as illustrated in FIG. 1 to FIG. 2C to generate the output clock signals ICKO and QCKO, respectively, by weighting and synthesizing the input clock signals ICKI and QCKI based on the PI code. Incidentally, the input clock signals ICKI and QCKI and the output clock signals ICKO and QCKO are each composed of a pair of complementary signals consisting of a non-inverted signal (ICKIP, QCKIP, ICKOP, and QCKOP) and an inverted signal (ICKIN, QCKIN, ICKON, and QCKON).

A comparator 704 uses the first output clock signal ICKO (ICKOP, ICKON) output from the phase interpolator circuit 701 to acquire data signal DT from an input signal. A comparator 705 uses the second output clock signal QCKO (QCKOP, QCKON) output from the phase interpolator circuit 701 to acquire a boundary signal BD from an input signal. One of a reception signal DTIN and an internal data signal dataQ is input to the comparators 704 and 705 via a selector 708. Normally, the reception signal DTIN is input to the comparators 704 and 705, and the internal data signal dataQ is input to the comparators 704 and 705 when determining the correction code (during the calibration operation).

A frequency dividing circuit 706 divides the frequency of the second output clock signal QCKO (QCKOP, QCKON) output from the phase interpolator circuit 701 by two. A variable delay circuit 707 delays the output clock signal QCKOP within the second output clock signal QCKO whose frequency is divided by the frequency dividing circuit 706 and outputs it as the internal data signal dataQ. The internal data signal dataQ has half the frequency of the output clock signal QCKOP.

Figure 8A:
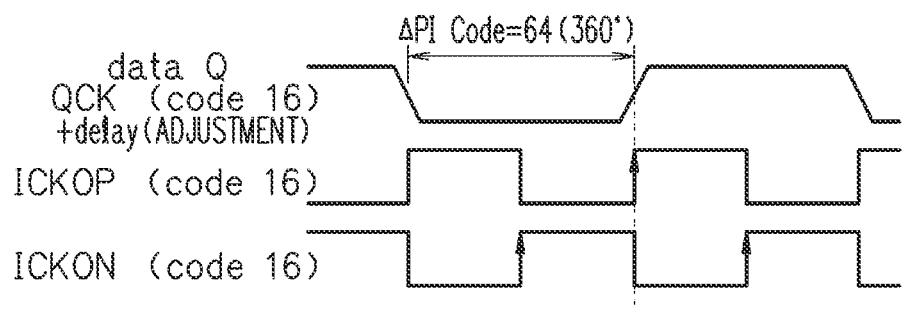
FIG. 8A is a view explaining calibration in the first embodiment.

When determining the correction code, the PI code is first set to 16. As a result, the phase interpolator circuit 701 generates the output clock signals ICKO and QCKO each having a phase (output phase of 90 degrees) according to the PI code based on the input clock signals ICKI and QCKI respectively. The selector 708 outputs the internal data signal dataQ, namely, the frequency-divided output clock signal QCKOP, via the variable delay circuit 707. Then, edge detection of the internal data signal dataQ is performed using the comparator 704. At this time, based on the data signal DT acquired in the comparator 704 using the output clock signal ICKOP within the output clock signal ICKO and the data signal DT acquired in the comparator 704 using the output clock signal ICKON, for example, a later-described CDR circuit is used to determine whether the phases of the output clock signals ICKOP and ICKON are advanced or delayed relative to the internal data signal dataQ, and adjust the delay amount of the variable delay circuit 707 to converge rising of the output clock signal ICKOP to the edge of the internal data signal dataQ, as illustrated in FIG. 8A. During this period when the PI code is set to 16, the correction code is kept to be 0 and no correction current is supplied.

Figure 8B:
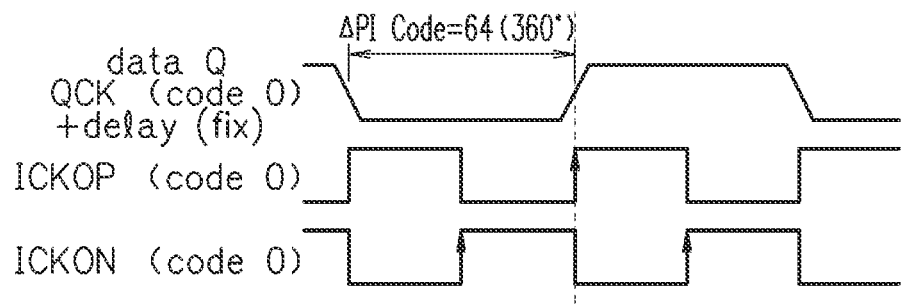
FIG. 8B is a view explaining calibration in the first embodiment.

Then, the PI code is set to 0. As a result, the phase interpolator circuit 701 generates the output clock signals ICKO and QCKO each having a phase according to the PI code (output phase of 0 degrees) based on the input clock signals ICKI and QCKI respectively. The selector 708 outputs the internal data signal dataQ, namely, the frequency-divided output clock signal QCKOP, via the variable delay circuit 707. The delay amount of the variable delay circuit 707 is fixed to the delay amount when the PI code is set to 16 and rising of the output clock signal ICKOP is converged to the edge of the internal data signal dataQ. Then, edge detection of the internal data signal dataQ is performed using the comparator 704. At this time, based on the data signal DT acquired in the comparator 704 using the output clock signal ICKOP within the output clock signal ICKO and the data signal DT acquired in the comparator 704 using the output clock signal ICKON, for example, a later-described CDR circuit is used to determine whether the phases of the output clock signals ICKOP and ICKON are advanced or delayed relative to the internal data signal dataQ, and change the correction code to adjust the current amount of the correction current, and as illustrated in FIG. 8B, rising of the input clock signal ICKOP is converged to the edge of the internal data signal dataQ.

Figure 9A:
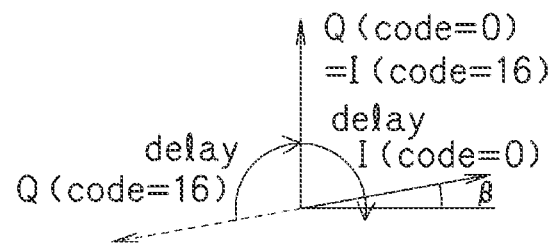
FIG. 9A is a view explaining calibration in the first embodiment.
Figure 9B:
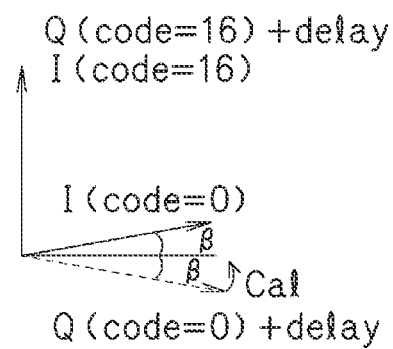
FIG. 9B is a view explaining calibration in the first embodiment.

The phase relationship between the output clock signals ICKO and QCKO in the above operation is as illustrated in FIG. 9A. Therefore, the PI code is set to 0 and half the correction current amount when rising of the input clock signal ICKOP is converged to the edge of the internal data signal dataQ is applied, and thereby the corrected phase difference between the output clock signals ICKO and QCKO becomes 90 degrees, as illustrated in FIG. 9B. Accordingly, it is only necessary to set the PI code to 0 and determine half the value of the correction code when rising of the input clock signal ICKOP is converged to the edge of the internal data signal dataQ as the correction code to be used in the normal operation.

Second Embodiment

Next, there is explained a second embodiment.
In the first embodiment, the current source relating to the input clock signal ICKI (ICKIP and ICKIN) is the transistors 113 and 123, and the current source relating to the input clock signal QCKI (QCKIP and QCKIN) is the transistors 134 and 144 in addition to the transistors 133 and 143. That is, in the phase interpolator circuit in the first embodiment, there is a difference in the circuit configuration as the differential pair.

In the second embodiment, the current according to the current control code PIB and the current according to the correction code CAL and the current control code PIA are synthesized, and the voltage according to the synthesized current is supplied to a gate of a transistor serving as a current source. This enables operation with one current source, resulting in that the differential pairs in the phase interpolator circuit have the same circuit configuration. As a result, the layout size of the differential pairs can be reduced, and an increase in capacitive load in the differential pair can be inhibited.

Figure 10:
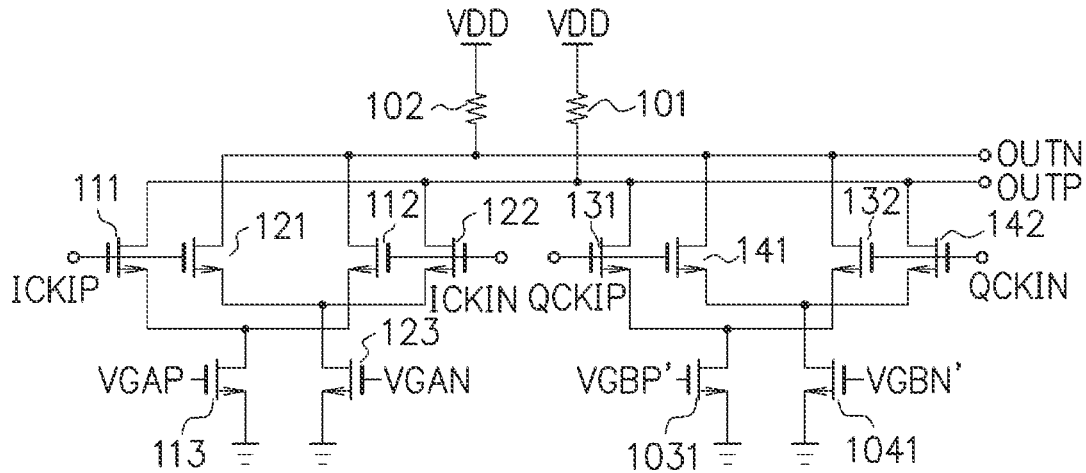
FIG. 10 is a diagram illustrating a configuration example of a phase interpolator circuit in a second embodiment.

FIG. 10 is a diagram illustrating a configuration example of a phase interpolator circuit in the second embodiment. In FIG. 10, components having the same functions as those illustrated in FIG. 1 are denoted by the same reference numerals and symbols, and redundant explanations are omitted. The phase interpolator circuit in the second embodiment includes the resistors 101 and 102 and the transistors 111 to 113, 121 to 123, 131 to 132, and 141 to 142, and transistors 1031 and 1041. The transistors 111 to 113, 121 to 123, 131 to 132, 141 to 142, 1031, and 1041 are, for example, N-type MOSFETs.

The source of the transistor 131 and the source of the transistor 132 are commonly connected to a drain of the transistor 1031. A source of the transistor 1031 is grounded. A gate voltage VGBP' is applied to a gate of the transistor 1031 according to the PI code and the correction code. The transistor 1031 serves as a current source that supplies current to the transistors 131 and 132 according to the PI code and the correction code.

The source of the transistor 141 and the source of the transistor 142 are commonly connected to a drain of the transistor 1041. A source of the transistor 1041 is grounded. A gate voltage VGBN' is applied to a gate of the transistor 1041 according to the PI code and the correction code. The transistor 1041 serves as a current source that supplies current to the transistors 141 and 142 according to the PI code and the correction code.

In the example illustrated in FIG. 10, the transistors 131, 132, 141, and 142 and the transistors 1031 and 1041 are examples of the second generation circuit that generates the second intermediate current for the connection points with the resistors 101 and 102 based on the second input clock signals QCKIP and QCKIN according to the PI code.

Figure 11A:
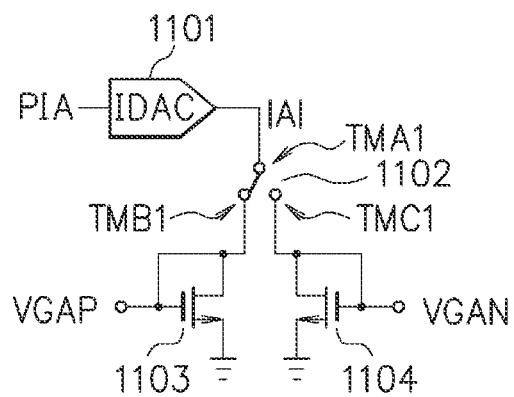
FIG. 11A is a diagram illustrating a configuration example of a gate voltage control circuit of the phase interpolator circuit in the second embodiment.

FIG. 11A is a diagram illustrating a configuration example of a gate voltage control circuit that controls the gate voltages VGAP and VGAN to be applied to the gates of the transistors 113 and 123 illustrated in FIG. 10. As illustrated in FIG. 11A, the gate voltage control circuit includes a current DAC 1101, a switch 1102, and transistors 1103 and 1104.

The current DAC 1101 outputs a current according to the absolute value of a code value of the current control code PIA to be input. The switch 1102 is controlled according to the sign of the current control code PIA. The switch 1102 connects a first terminal TMA1 to a second terminal TMB1 when the current control code PIA is positive, and connects the first terminal TMA1 to a third terminal TMC1 when the current control code PIA is negative. The first terminal TMA1 of the switch 1102 is connected to an output end of the current DAC 1101.

The transistor 1103 is diode-connected between the second terminal TMB1 of the switch 1102 and ground. That is, a drain and a gate of the transistor 1103 are connected to the second terminal TMB1 of the switch 1102, and a source of the transistor 1103 is grounded. The transistor 1104 is diode-connected between the third terminal TMC1 of the switch 1102 and ground. That is, a drain and a gate of the transistor 1104 are connected to the third terminal TMC1 of the switch 1102, and a source of the transistor 1104 is grounded. The voltage generated by the diode-connected transistor 1103 is output as the gate voltage VGAP, and the voltage generated by the diode-connected transistor 1104 is output as the gate voltage VGAN.

Figure 11B:
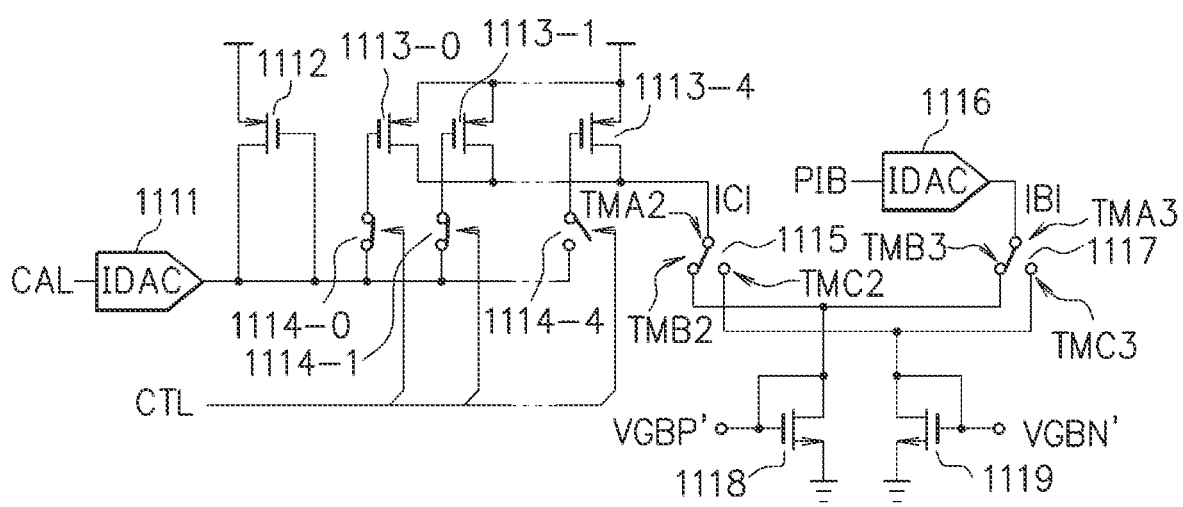
FIG. 11B is a diagram illustrating a configuration example of a gate voltage control circuit of the phase interpolator circuit in the second embodiment.

FIG. 11B is a diagram illustrating a configuration example of a gate voltage control circuit that controls the gate voltages VGBP' and VGBN' to be applied to the gates of the transistors 1031 and 1041 illustrated in FIG. 10. As illustrated in FIG. 11B, the gate voltage control circuit includes current DACs 1111 and 1116, transistors 1112, 1113-$i$, 1118, and 1119, and switches 1114-$i$, 1115, and 1117.

The current DAC 1111 outputs a current according to the absolute value of a code value of the input correction code CAL. The transistor 1112 has a source thereof connected to the power supply VDD, and has a drain and a gate thereof connected to an output end of the current DAC 1111.

The transistor 1113-$i$ has a source thereof connected to the power supply VDD and has a gate thereof connected to the gate of the transistor 1112 via the switch 1114-$i$. When the respective corresponding switches 1114-$i$ are in a continuity state (on state), the transistors 1113-0 and 1113-1 are configured so that (1/16) times the mirror current flows, and the transistor 1113-2 is configured so that (2/16) times the mirror current flows. Similarly, the transistor 1113-3 is configured so that (4/16) times the mirror current flows, and the transistor 1113-4 is configured so that (8/16) times the mirror current flows. The switch 1114-$i$ is on/off controlled by the control signal CTL based on the current control code PIA so that the mirror ratio of a current mirror circuit formed of the transistor 1112 and the transistor 1113-$i$ varies in proportion to the current control code PIA.

The switch 1115 is controlled according to the sign of the product value of the correction code CAL and the current control code PIA. The switch 1115 connects a first terminal TMA2 to a second terminal TMB2 when the product value of the correction code CAL and the current control code PIA is positive, and connects the first terminal TMA2 to a third terminal TMC2 when the product value of the correction code CAL and the current control code PIA is negative. A drain of the transistor 1113-$i$ is commonly connected to the first terminal TMA2 of the switch 1115.

The current DAC 1116 outputs a current according to the absolute value of a code value of the input current control code PIB. The switch 1117 is controlled according to the sign of the current control code PIB. The switch 1117 connects a first terminal TMA3 to a second terminal TMB3 when the current control code PIB is positive, and connects the first terminal TMA3 to a third terminal TMC3 when the current control code PIB is negative. The first terminal TMA3 of the switch 1117 is connected to an output end of the current DAC 1116.

The second terminal TMB2 of the switch 1115 and the second terminal TMB3 of the switch 1117 are connected. The third terminal TMC2 of the switch 1115 and the third terminal TMC3 of the switch 1117 are connected.

The transistor 1118 is diode-connected between the connection point between the second terminal TMB2 of the switch 1115 and the second terminal TMB3 of the switch 1117 and ground. That is, a drain and a gate of the transistor 1118 are connected to the connection point between the second terminal TMB2 of the switch 1115 and the second terminal TMB3 of the switch 1117, and a source of the transistor 1118 is grounded. The transistor 1119 is diode-connected between the connection point between the third terminal TMC2 of the switch 1115 and the third terminal TMC3 of the switch 1117 and ground. That is, a drain and a gate of the transistor 1119 are connected to the connection point between the third terminal TMC2 of the switch 1115 and the third terminal TMC3 of the switch 1117, and a source of the transistor 1119 is grounded.

With this configuration, the current according to the correction code CAL and the current control code PIA and the current according to the current control code PIB are synthesized at the connection point between the second terminal TMB2 of the switch 1115 and the second terminal TMB3 of the switch 1117, and the voltage generated by the diode-connected transistor 1118 based on the synthesized current is output as the gate voltage VGBP'. The current according to the correction code CAL and the current control code PIA and the current according to the current control code PIB are synthesized at the connection point between the third terminal TMC2 of the switch 1115 and the third terminal TMC3 of the switch 1117, and the voltage generated by the diode-connected transistor 1119 based on the synthesized current is output as the gate voltage VGBN'.

In the example illustrated in FIG. 10, the transistors 1031 and 1041 and the gate voltage control circuit illustrated in FIG. 11B are examples of the correction circuit that corrects the current amount of at least one of the first intermediate current and the second intermediate current based on the correction current according to the correction code.

Also in the second embodiment, the current amount of the intermediate currents output from the transistors 131, 132, 141, and 142 is corrected based on the correction current according to the correction code and the PI code, and the phase of the output clock signal obtained by synthesizing the intermediate currents is adjusted. This makes it possible for the phase interpolator circuit to adjust the phase difference between the output clock signals (ICKO and QCKO) to a certain phase difference (90 degrees) and inhibit the phase difference shift in the output clock signals (ICKO and QCKO). Accordingly, it is possible to prevent the timing margin of the circuit using the output clock signals (ICKO and QCKO) from becoming small and achieve high-speed operations.

Third Embodiment

Next, there is explained a third embodiment.

The configuration of the phase interpolator circuit in the third embodiment is the same as that of the phase interpolator circuit in the second embodiment illustrated in FIG. 10. Further, in the third embodiment, the configuration of the gate voltage control circuit that controls the gate voltages VGAP and VGAN to be applied to the gates of the transistors 113 and 123 illustrated in FIG. 10 is the same as that of the second embodiment illustrated in FIG. 11A. The third embodiment differs from the second embodiment described above in the gate voltage control circuit that controls the gate voltages VGBP' and VGBN' to be applied to the gates of the transistors 1031 and 1041 illustrated in FIG. 10. The following explains the gate voltage control circuit that controls the gate voltages VGBP' and VGBN' in the third embodiment.

FIG. 12A is a diagram illustrating a configuration example of the gate voltage control circuit that controls the gate voltages VGBP' and VGBN' to be applied to the gates of the transistors 1031 and 1041. As illustrated in FIG. 12A, the gate voltage control circuit includes current DACs 1201 and 1203, switches 1202 and 1204, and transistors 1205 and 1206.

The current DAC 1201 outputs a current according to the absolute value of a code value of a correction code CAL' to be input. The correction code CAL' is the code value calculated based on the correction code CAL and the current control code PIA. The correction code CAL' is the value obtained by multiplying the correction code CAL by the ratio according to the current control code PIA, for example, the ratio of the present value of the current control code PIA corresponding to the PI code to its maximum value (corresponding to the mirror ratio in the current mirror circuit illustrated in FIG. 11B). The correction code CAL' is, for example, the value described as code of "Q CORRECTION CURRENT: CAL'" in FIG. 12C. Incidentally, the multiplication of the correction code CAL by the ratio according to the current control code PIA only needs to be performed by, for example, a not-illustrated logic circuit. In this embodiment, the current DAC 1201 is preferably a current DAC having high resolution because it can take decimal values as the correction code CAL'.

The switch 1202 is controlled according to the sign of the correction code CAL'. The switch 1202 connects a first terminal TMA4 to a second terminal TMB4 when the correction code CAL' is positive, and connects the first terminal TMA4 to a third terminal TMC4 when the correction code CAL' is negative. The first terminal TMA4 of the switch 1202 is connected to an output end of the current DAC 1201.

The current DAC 1203 outputs a current according to the absolute value of a code value of the current control code PIB to be input. The switch 1204 is controlled according to the sign of the current control code PIB. The switch 1204 connects a first terminal TMA5 to a second terminal TMB5 when the current control code PIB is positive, and 1204 connects the first terminal TMA5 to a third terminal TMC5 when the current control code PIB is negative. The first terminal TMA5 of the switch 1204 is connected to an output end of the current DAC 1203.

The second terminal TMB4 of the switch 1202 and the second terminal TMB5 of the switch 1204 are connected. The third terminal TMC4 of the switch 1202 and the third terminal TMC5 of the switch 1204 are connected.

The transistor 1205 is diode-connected between the connection point between the second terminal TMB4 of the switch 1202 and the second terminal TMB5 of the switch 1204 and ground. That is, a drain and a gate of the transistor 1205 are connected to the connection point between the second terminal TMB4 of the switch 1202 and the second terminal TMB5 of the switch 1204, and a source of the transistor 1205 is grounded. The transistor 1206 is diode-connected between the connection point between the third terminal TMC4 of the switch 1202 and the third terminal TMC5 of the switch 1204 and ground. That is, a drain and a gate of the transistor 1206 are connected to the connection point between the third terminal TMC4 of the switch 1202 and the third terminal TMC5 of the switch 1204, and a source of the transistor 1206 is grounded.

With this configuration, the current according to the correction code CAL' based on the correction code CAL and the current control code PIA and the current according to the current control code PIB are synthesized at the connection point between the second terminal TMB4 of the switch 1202 and the second terminal TMB5 of the switch 1204, and the voltage generated by the diode-connected transistor 1205 based on the synthesized current is output as the gate voltage VGBP'. The current according to the correction code CAL' based on the correction code CAL and the current control code PIA and the current according to the current control code PIB are synthesized at the connection point between the third terminal TMC4 of the switch 1202 and the third terminal TMC5 of the switch 1204, and the voltage generated by the diode-connected transistor 1206 based on the synthesized current is output as the gate voltage VGBN'.

In the example illustrated in FIG. 10, the transistors 1031 and 1041 and the gate voltage control circuit illustrated in FIG. 12A are examples of the correction circuit that corrects the current amount of at least one of the first intermediate current and the second intermediate current based on the correction current according to the correction code.

Also in the case where the gate voltage control circuit illustrated in FIG. 12A is applied, the current amount of the intermediate currents output from the transistors 131, 132, 141, and 142 is corrected according to the correction code and the PI code, and the phase of the output clock signal obtained by synthesizing the intermediate currents is adjusted. This makes it possible for the phase interpolator circuit to adjust the phase difference between the output clock signals (ICKO and QCKO) to a certain phase difference (90 degrees) and inhibit the phase difference shift in the output clock signals (ICKO and QCKO).

FIG. 12B is a diagram illustrating another configuration example of the gate voltage control circuit that controls the gate voltages VGBP' and VGBN' to be applied to the gates of the transistors 1031 and 1041. As illustrated in FIG. 12B, the gate voltage control circuit includes a current DAC 1211, a switch 1212, and transistors 1213 and 1214.

The current DAC 1211 outputs a current according to the absolute value of a code value of a current control code PIB' to be input. The current control code PIB' is the code value obtained by adding the current control code PIB and the previously-described correction code CAL' together. That is, the current control code PIB' is the value obtained by adding the value, which is obtained by multiplying the correction code CAL by the ratio according to the current control code PIA, for example, the ratio of the present value of the current control code PIA corresponding to the PI code to its maximum value, and the value of the current control code PIB together. The current control code PIB' is, for example, the value described as code of "Q CORRECTION CURRENT: PIB'" in FIG. 12C. Incidentally, the calculation of the current control code PIB' only needs to be performed by, for example, a not-illustrated logic circuit. In this embodiment, the current DAC 1211 is preferably a current DAC having high resolution because it can take decimal values as the current control code PIB'.

The switch 1212 is controlled according to the sign of the current control code PIB'. The switch 1212 connects a first terminal TMA6 to a second terminal TMB6 when the current control code PIB' is positive, and connects the first terminal TMA6 to a third terminal TMC6 when the current control code PIB' is negative. The first terminal TMA6 of the switch 1212 is connected to an output end of the current DAC 1211.

The transistor 1213 is diode-connected between the second terminal TMB6 of the switch 1212 and ground. That is, a drain and a gate of the transistor 1213 are connected to the second terminal TMB6 of the switch 1212, and a source of the transistor 1213 is grounded. The transistor 1214 is diode-connected between the third terminal TMC6 of the switch 1212 and ground. That is, a drain and a gate of the transistor 1214 are connected to the third terminal TMC6 of the switch 1212, and a source of the transistor 1214 is grounded.

With this configuration, when the current control code PIB' is positive, the voltage generated by the diode-connected transistor 1213 based on the current according to the current control code PIB' is output as the gate voltage VGBP'. When the current control code PIB' is negative, the voltage generated by the diode-connected transistor 1214 based on the current according to the current control code PIB' is output as the gate voltage VGBN'.

In the example illustrated in FIG. 10, the transistors 1031 and 1041 and the gate voltage control circuit illustrated in FIG. 12B are examples of the correction circuit that corrects the current amount of at least one of the first intermediate current and the second intermediate current based on the correction current according to the correction code.

Also in the case where the gate voltage control circuit illustrated in FIG. 12B is applied, the current amount of the intermediate currents output from the transistors 131, 132, 141, and 142 is corrected according to the correction code and the PI code, and the phase of the output clock signal obtained by synthesizing the intermediate currents is adjusted. This makes it possible for the phase interpolator circuit to adjust the phase difference between the output clock signals (ICKO and QCKO) to a certain phase difference (90 degrees) and inhibit the phase difference shift in the output clock signals (ICKO and QCKO).

Incidentally, the previously-described first to third embodiments are designed so that the correction current is supplied to the differential pair to which the second input clock signal QCKI (QCKIP and QCKIN) is input, but the embodiments are not limited to this design. They may be designed so that the correction current is supplied to the differential pair to which the first input clock signal ICKI (ICKIP and ICKIN) is input.

Figure 4A:
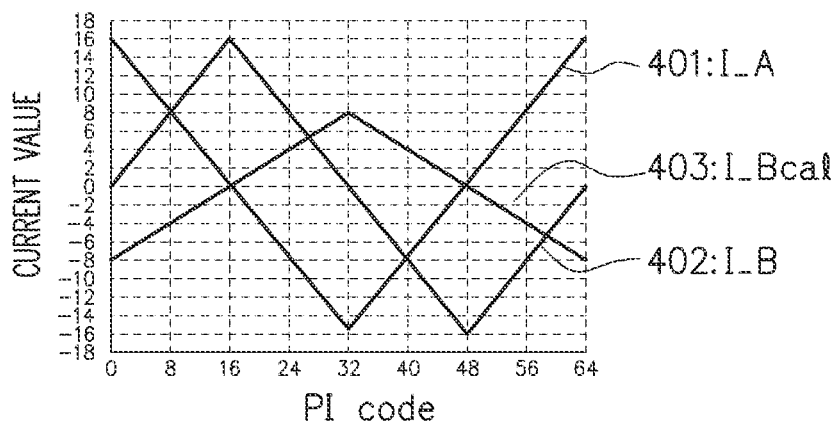
FIG. 4A is a view explaining the relationship between a PI code and a current.
Figure 4B:
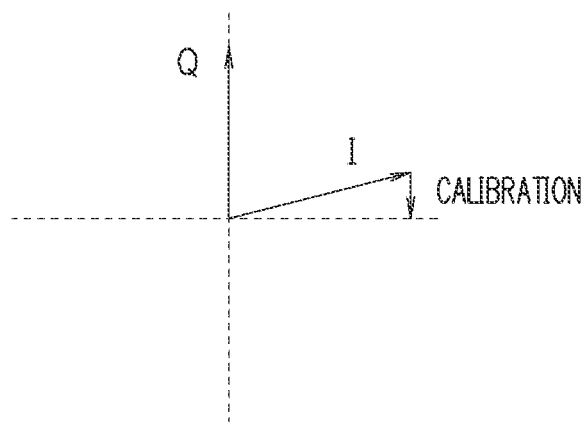
FIG. 4B is a view explaining correction of a phase difference shift between two clock signals.

In the phase interpolator circuit in each of the previously-described embodiments, like the currents I_A and I_B indicated by the solid lines 401 and 402 illustrated in FIG. 4A, the sum of the currents according to the PI code (current control codes PIA and PIB) (sum of the absolute values) is constant regardless of the PI code, but the sum of the currents (sum of the absolute values) varies with the PI code because the correction current according to the correction code CAL is added. Therefore, as the correction current increases, the common mode voltage in the outputs from the output ends OUTP and OUTN of the phase interpolator circuit may shift due to the effect of the correction current.

The following explains a phase interpolator circuit including a common mode voltage correction circuit that inhibits variations in the common mode voltage so that the sum of the currents flowing through the phase interpolator circuit is kept constant and the common mode voltage in the output of the phase interpolator circuit is kept constant even if the correction current varies.

Fourth Embodiment

Figure 20:
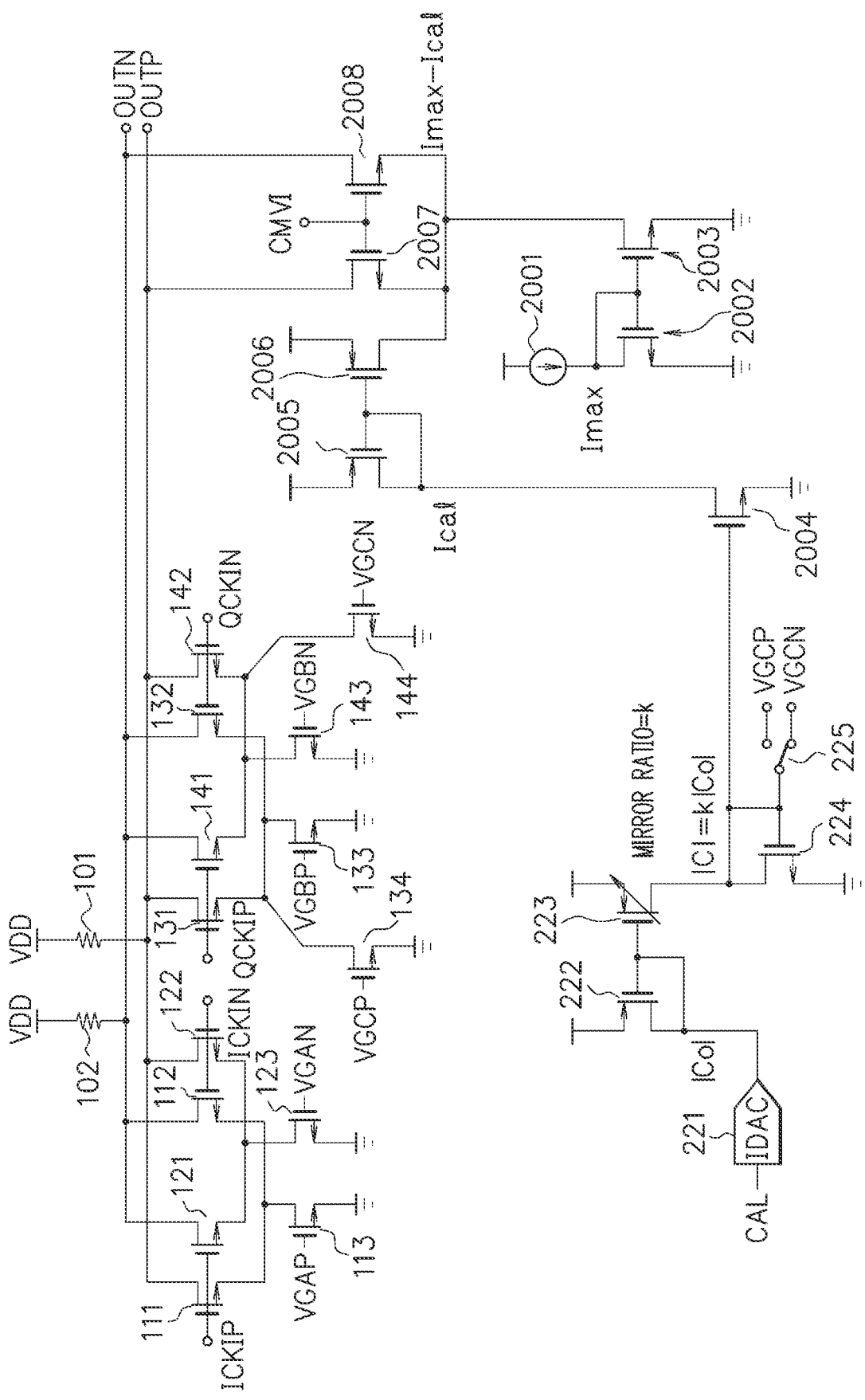
FIG. 20 is a diagram illustrating a configuration example of a phase interpolator circuit in a fourth embodiment.

FIG. 20 is a diagram illustrating a configuration example of a phase interpolator circuit in a fourth embodiment. In FIG. 20, components having the same functions as those illustrated in FIG. 1 and FIG. 2C are denoted by the same reference numerals and symbols, and redundant explanations are omitted. The phase interpolator circuit in the fourth embodiment illustrated in FIG. 20 is an example of the phase interpolator circuit, which corresponds to the first embodiment described above, provided with a common mode voltage correction circuit. The gate voltage control circuit that controls the gate voltages VGAP and VGAN to be applied to the gates of the transistors 113 and 123 and the gate voltage control circuit that controls the gate voltages VGBP and VGBN to be applied to the gates of the transistors 133 and 143 are not illustrated, but are the same as those in the first embodiment.

In the phase interpolator circuit in the fourth embodiment, the common mode voltage correction circuit includes a current source 2001 and transistors 2002 to 2008. The transistors 2002 to 2004, 2007, and 2008 are, for example, N-type MOSFETs, and the transistors 2005 and 2006 are, for example, P-type MOSFETs.

The current source 2001 is a current source that supplies a current Imax. The current Imax is, for example, the current according to the maximum value of the correction current, that is, the absolute value of the code value of the correction code CAL, which flows through the phase interpolator circuit. The transistor 2002 has a source thereof grounded and has a drain and a gate thereof connected to the current source 2001. The transistor 2003 has a source thereof grounded and has a gate thereof connected to the gate of the transistor 2002. The transistor 2002 and the transistor 2003 form a current mirror circuit, which is configured so that the current Imax flows in the transistor 2003.

The transistor 2004 has a source thereof grounded and has a gate thereof connected to the gate of the transistor 224 included in the gate voltage control circuit that controls the gate voltages VGCP and VGCN. The transistor 2004 and the transistor 224 form a current mirror circuit, which is configured so that a current Ical flows in the transistor 2004. The current Ical in this embodiment is the current (|C|) obtained by multiplying the current (|C0|) according to the absolute value of the code value of the correction code CAL by k according to the current control code PIA, that is, the correction current.

The transistor 2005 has a source thereof connected to the power supply VDD and has a drain and a gate thereof connected to the drain of the transistor 2004. The transistor 2006 has a source thereof connected to the power supply VDD and has a gate thereof connected to the gate of the transistor 2005. The transistor 2005 and the transistor 2006 form a current mirror circuit. Therefore, the current Ical flows in the transistor 2006.

A source of the transistor 2007 and a source of the transistor 2008 are commonly connected to a drain of the transistor 2003 and a drain of the transistor 2006. A drain of the transistor 2007 is connected to the output end OUTP and a drain of the transistor 2008 is connected to the output end OUTN. A voltage CMVI is applied to a gate of the transistor 2007 and a gate of the transistor 2008. The voltage CMVI is, for example, a voltage equal to the common mode voltage of the input clock signals ICKI (ICKIP, ICKIN) and QCKI (QCKIP, QCKIN).

When the correction current according to the correction code and the PI code flows in the gate voltage control circuit that controls the gate voltages VGCP and VGCN in order to correct the current amount of the intermediate currents output from the transistors 131, 132, 141, and 142, by the current mirror circuit formed of the transistor 224 and the transistor 2004 and the current mirror circuit formed of the transistor 2005 and the transistor 2006, the current Ical, which is equal to the correction current according to the correction code and the PI code, flows in the transistor 2006. Further, by the current mirror circuit formed of the transistor 2002 and the transistor 2003, the current Imax flows in the transistor 2003. Therefore, a differential pair consisting of the transistor 2007 and the transistor 2008 having the sources thereof commonly connected to the drain of the transistor 2003 and the drain of the transistor 2006, allows a current of (Imax−Ical) to flow to the phase interpolator circuit. As a result, by subtracting the current Ical equal to the correction current by the transistor 2006, even if the correction current varies, the amount of currents at the output ends OUTP and OUTN can be kept constant, inhibiting the common mode voltage from varying in response to the correction current.

Fifth Embodiment

Figure 21:
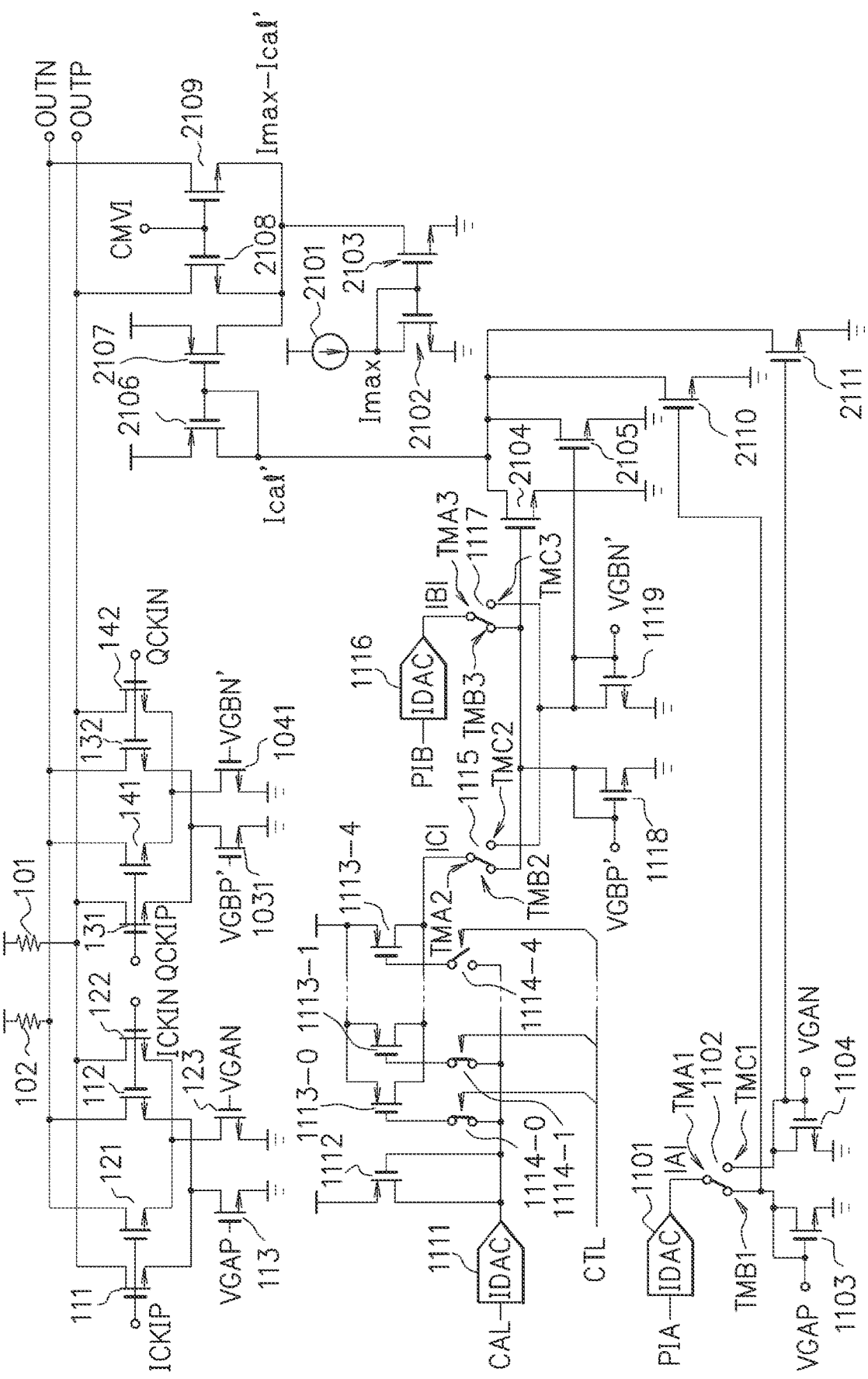
FIG. 21 is a diagram illustrating a configuration example of a phase interpolator circuit in a fifth embodiment.

FIG. 21 is a diagram illustrating a configuration example of a phase interpolator circuit in a fifth embodiment. In FIG. 21, components having the same functions as those illustrated in FIG. 10, FIG. 11A, and FIG. 11B are denoted by the same reference numerals and symbols, and redundant explanations are omitted. The phase interpolator circuit in the fifth embodiment illustrated in FIG. 21 is an example of the phase interpolator circuit, which corresponds to the second embodiment described above, provided with a common mode voltage correction circuit.

In the phase interpolator circuit according to the fifth embodiment, the common mode voltage correction circuit includes a current source 2101 and transistors 2102 to 2111. The transistors 2102 to 2105 and 2108 to 2111 are, for example, N-type MOSFETs, and the transistors 2106 and 2107 are, for example, P-type MOSFETs.

The current source 2101 is a current source that supplies the current Imax. The current Imax is, for example, the current corresponding to the added value of the maximum value of the current according to the current control code PIA, the maximum value of the current according to the current control code PIB, and the maximum value of the correction current, which flows through the phase interpolator circuit. The transistor 2102 has a source thereof grounded and has a drain and a gate thereof connected to the current source 2101. The transistor 2103 has a source thereof grounded and has a gate thereof connected to the gate of the transistor 2102. The transistor 2102 and the transistor 2103 form a current mirror circuit, which is configured so that current Imax flows in the transistor 2103.

The transistor 2104 has a source thereof grounded and has a gate thereof connected to the connection point between the second terminal TMB2 of the switch 1115 and the second terminal TMB3 of the switch 1117 that are included in the gate voltage control circuit. The transistor 2105 has a source thereof grounded and has a gate thereof connected to the connection point between the third terminal TMC2 of the switch 1115 and the third terminal TMC3 of the switch 1117 that are included in the gate voltage control circuit. The transistor 2110 has a source thereof grounded and has a gate thereof connected to the second terminal TMB1 of the switch 1102 included in the gate voltage control circuit. The transistor 2111 has a source thereof grounded and has a gate thereof connected to the third terminal TMC1 of the switch 1102 included in the gate voltage control circuit.

The transistor 2106 has a source thereof connected to the power supply VDD, and has a drain and a gate thereof connected to a drain of the transistor 2104, a drain of the transistor 2105, a drain of the transistor 2110, and a drain of the transistor 2111. Therefore, a current Ical', which is equal to the combined current of the current according to the current control code PIA, the current according to the current control code PIB, and the current according to the correction code CAL and the current control code PIA, flows in the transistor 2106. The transistor 2107 has a source thereof connected to the power supply VDD and has a gate thereof connected to the gate of the transistor 2106. The transistor 2106 and the transistor 2107 form a current mirror circuit. Therefore, the current Ical' flows in the transistor 2107.

A source of the transistor 2108 and a source of the transistor 2109 are commonly connected to a drain of the transistor 2103 and a drain of the transistor 2107. A drain of the transistor 2108 is connected to the output end OUTP, and a drain of the transistor 2109 is connected to the output end OUTN. The voltage CMVI is applied to a gate of the transistor 2108 and a gate of the transistor 2109. The voltage CMVI is, for example, a voltage equal to the common mode voltage of the input clock signals ICKI (ICKIP and ICKIN) and QCKI (QCKIP and QCKIN).

When the correction current according to the correction code and the PI code for correcting the current amount of the intermediate currents output from the transistors 131, 132, 141, and 142 flows in the gate voltage control circuit that controls the gate voltages VGBP' and VGBN', the current Ical', which is equal to the combined current of the current according to the current control code PIA, the current according to the current control code PIB, and the correction current according to the correction code CAL and the current control code PIA, flows in the transistor 2107. Further, by the current mirror circuit formed of the transistor 2102 and the transistor 2103, the current Imax flows in the transistor 2103. Therefore, a differential pair consisting of the transistor 2108 and the transistor 2109 having the sources thereof commonly connected to the drain of the transistor 2103 and the drain of the transistor 2107, allows a current of (Imax− Ical') to flow to the phase interpolator circuit. The current Ical' is equal to the sum of the current according to the current control code PIA, the current according to the current control code PIB, and the correction current according to the correction code CAL and the current control code PIA. The sum of the current according to the current control code PIA and the current according to the current control code PIB is constant. As a result, by subtracting the current Ical' containing the current equal to the correction current by the transistor 2107, even if the correction current varies, the amount of currents at the output ends OUTP and OUTN can be kept constant, inhibiting the common mode voltage from varying in response to the correction current.

Sixth Embodiment

Figure 22:
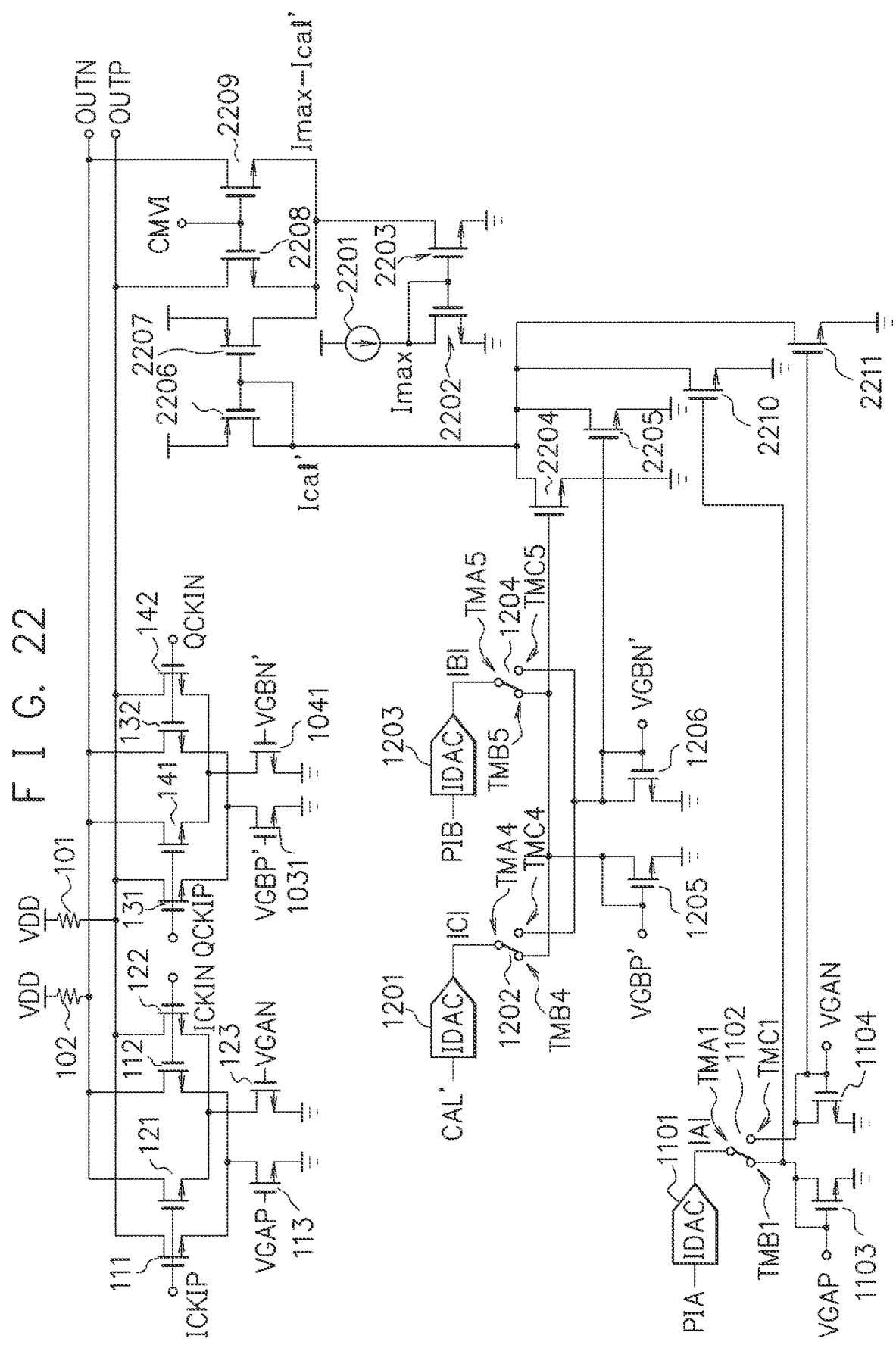
FIG. 22 is a diagram illustrating a configuration example of a phase interpolator circuit in a sixth embodiment.

FIG. 22 is a diagram illustrating a configuration example of a phase interpolator circuit in a sixth embodiment. In FIG. 22, components having the same functions as those illustrated in FIG. 10, FIG. 11A, and FIG. 12A are denoted by the same reference numerals and symbols, and redundant explanations are omitted. The phase interpolator circuit in the sixth embodiment illustrated in FIG. 22 is an example where the phase interpolator circuit corresponding to the third embodiment with the gate voltage control circuit illustrated in FIG. 12A applied thereto, is provided with a common mode voltage correction circuit.

In the phase interpolator circuit in the sixth embodiment, the common mode voltage correction circuit includes a current source 2201 and transistors 2202 to 2211. The transistors 2202 to 2205 and 2208 to 2211 are, for example, N-type MOSFETs, and the transistors 2206 and 2207 are, for example, P-type MOSFETs.

The current source 2201 is a current source that supplies the current Imax. The current Imax is, for example, the current corresponding to the added value of the maximum value of the current according to the current control code PIA, the maximum value of the current according to the current control code PIB, and the maximum value of the correction current, which flows through the phase interpolator circuit. The transistor 2202 has a source thereof grounded and has a drain and a gate thereof connected to the current source 2201. The transistor 2203 has a source thereof grounded and has a gate thereof connected to the gate of the transistor 2202. The transistor 2202 and the transistor 2203 form a current mirror circuit, which is configured so that the current Imax flows in the transistor 2203.

The transistor 2204 has a source thereof grounded and has a gate thereof connected to the connection point between the second terminal TMB4 of the switch 1202 and the second terminal TMB5 of the switch 1204 that are included in the gate voltage control circuit. The transistor 2205 has a source thereof grounded and has a gate thereof connected to the connection point between the third terminal TMC4 of the switch 1202 and the third terminal TMC5 of the switch 1204 that are included in the gate voltage control circuit. The transistor 2210 has a source thereof grounded and has a gate thereof connected to the second terminal TMB1 of the switch 1102 included in the gate voltage control circuit. The transistor 2211 has a source thereof grounded and has a gate thereof connected to the third terminal TMC1 of the switch 1102 included in the gate voltage control circuit.

The transistor 2206 has a source thereof connected to the power supply VDD, and has a drain and a gate thereof connected to a drain of the transistor 2204, a drain of the transistor 2205, a drain of the transistor 2210, and a drain of the transistor 2211. Therefore, the current Ical', which is equal to the combined current of the current according to the current control code PIA, the current according to the current control code PIB, and the current according to the correction code CAL', flows in the transistor 2206. Here, the correction code CAL' is the code value calculated based on the correction code CAL and the current control code PIA as described above. The transistor 2207 has a source thereof connected to the power supply VDD and has a gate thereof connected to the gate of the transistor 2206. The transistor 2206 and the transistor 2207 form a current mirror circuit. Therefore, the current Ical' flows in the transistor 2207.

A source of the transistor 2208 and a source of the transistor 2209 are commonly connected to a drain of the transistor 2203 and a drain of the transistor 2207. A drain of the transistor 2208 is connected to the output end OUTP, and a drain of the transistor 2209 is connected to the output end OUTN. The voltage CMVI is applied to a gate of the transistor 2208 and a gate of the transistor 2209. The voltage CMVI is, for example, a voltage equal to the common mode voltage of the input clock signals ICKI (ICKIP and ICKIN) and QCKI (QCKIP and QCKIN).

When the correction current according to the correction code CAL' for correcting the current amount of the intermediate currents output from the transistors 131, 132, 141, and 142 flows in the gate voltage control circuit that controls the gate voltages VGBP' and VGBN', the current Ical', which is equal to the combined current of the current according to the current control code PIA, the current according to the current control code PIB, and the correction current according to the correction code CAL', flows in the transistor 2207. Further, by the current mirror circuit formed of the transistor 2202 and the transistor 2203, the current Imax flows in the transistor 2203. Therefore, a differential pair consisting of the transistor 2208 and the transistor 2209 having the sources thereof commonly connected to the drain of the transistor 2203 and the drain of the transistor 2207, allows a current of (Imax−Ical') to flow to the phase interpolator circuit. The current Ical' is equal to the sum of the current according to the current control code PIA, the current according to the current control code PIB, and the correction current according to the correction code CAL', namely, the correction code CAL and the current control code PIA. The sum of the current according to the current control code PIA and the current according to the current control code PIB is constant. As a result, by subtracting the current Ical' containing the current equal to the correction current by the transistor 2207, even if the correction current varies, the amount of currents at the output ends OUTP and OUTN can be kept constant, inhibiting the common mode voltage from varying in response to the correction current.

Figure 23:
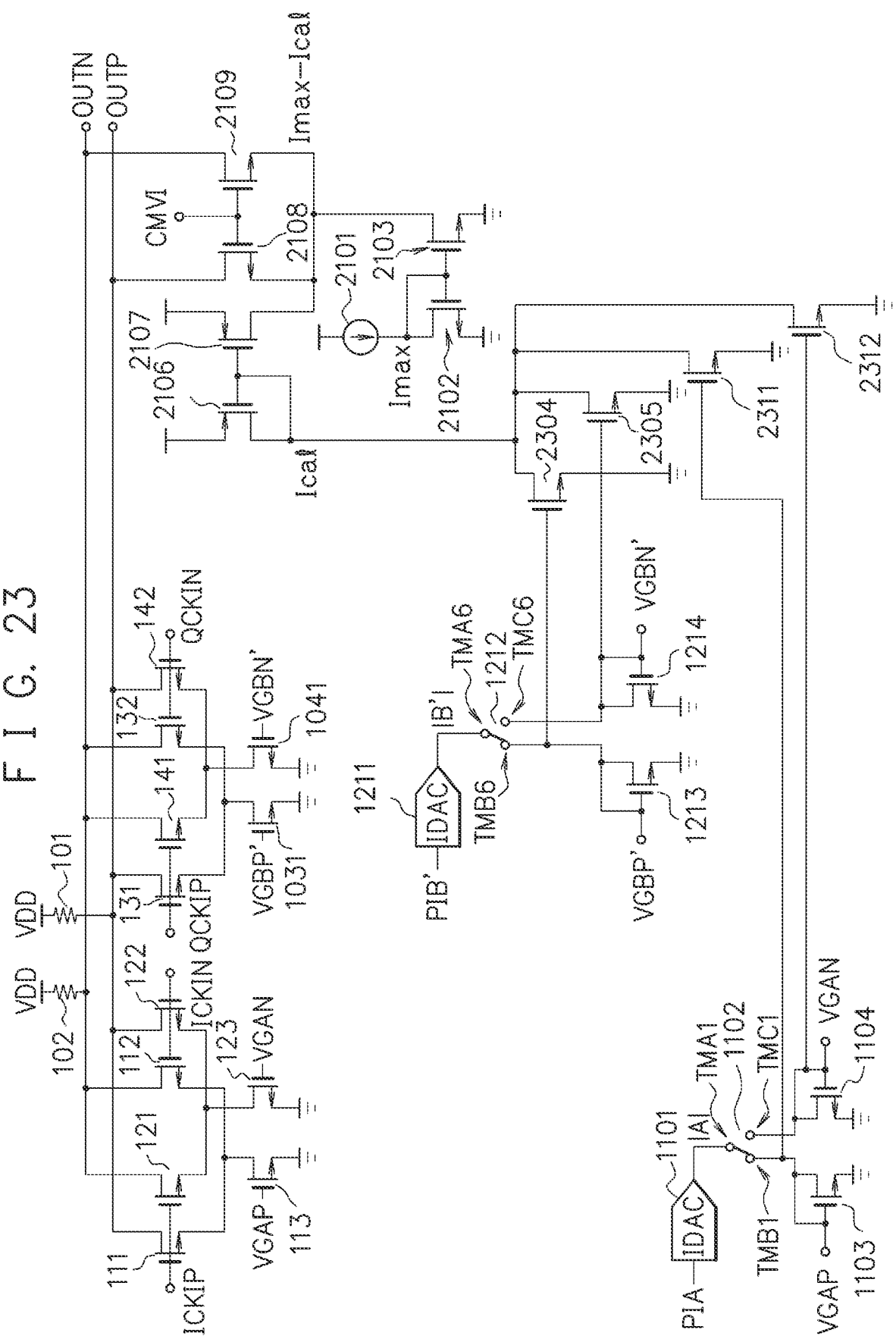
FIG. 23 is a diagram illustrating a configuration example of the phase interpolator circuit in the sixth embodiment.

FIG. 23 is a diagram illustrating another configuration example of the phase interpolator circuit in the sixth embodiment. In FIG. 23, components having the same functions as those illustrated in FIG. 10, FIG. 11A, and FIG. 12B are denoted by the same reference numerals and symbols, and redundant explanations are omitted. The phase interpolator circuit in the sixth embodiment illustrated in FIG. 23 is an example where the phase interpolator circuit corresponding to the third embodiment with the gate voltage control circuit illustrated in FIG. 12B applied thereto, is provided with a common mode voltage correction circuit.

In the phase interpolator circuit in the sixth embodiment illustrated in FIG. 23, the common mode voltage correction circuit includes a current source 2301 and transistors 2302 to 2309 and 2311 to 2312. The transistors 2302 to 2205, 2308 to 2309, and 2311 to 2312 are, for example, N-type MOSFETs, and the transistors 2306 and 2307 are, for example, P-type MOSFETs.

The current source 2301 is a current source that supplies the current Imax. The current Imax is, for example, the maximum value of the current according to the current control code PIA and the maximum value of the current according to the current control code PIB', which flows through the phase interpolator circuit. The current control code PIB' is the code value obtained by adding the current control code PIB and the correction code CAL' together as described previously. The transistor 2302 has a source thereof grounded and has a drain and a gate thereof connected to the current source 2301. The transistor 2303 has a source thereof grounded and has a gate thereof connected to the gate of the transistor 2302. The transistor 2302 and the transistor 2303 form a current mirror circuit, which is configured so that the current Imax flows in the transistor 2303.

The transistor 2304 has a source thereof grounded and has a gate thereof connected to the second terminal TMB6 of the switch 1212 included in the gate voltage control circuit. The transistor 2305 has a source thereof grounded and has a gate thereof connected to the third terminal TMC6 of the switch 1212 included in the gate voltage control circuit. The transistor 2311 has a source thereof grounded and has a gate thereof connected to the second terminal TMB1 of the switch 1102 included in the gate voltage control circuit. The transistor 2312 has a source thereof grounded and has a gate thereof connected to the third terminal TMC1 of the switch 1102 included in the gate voltage control circuit.

The transistor 2306 has a source thereof connected to the power supply VDD, and has a drain and a gate thereof connected to a drain of the transistor 2304, a drain of the transistor 2305, a drain of the transistor 2311, and a drain of the transistor 2312. Therefore, the current Ical', which is equal to the combined current of the current according to the current control code PIA and the current according to the current control code PIB', flows in the transistor 2306. The transistor 2307 has a source thereof connected to the power supply VDD and has a gate thereof connected to the gate of the transistor 2306. The transistor 2306 and the transistor 2307 form a current mirror circuit. Therefore, the current Ical' flows in the transistor 2307.

A source of the transistor 2308 and a source of the transistor 2309 are commonly connected to a drain of the transistor 2303 and a drain of the transistor 2307. A drain of the transistor 2308 is connected to the output end OUTP, and a drain of the transistor 2309 is connected to the output end OUTN. The voltage CMVI is applied to a gate of the transistor 2308 and a gate of the transistor 2309. The voltage CMVI is, for example, a voltage equal to the common mode voltage of the input clock signals ICKI (ICKIP and ICKIN) and QCKI (QCKIP and QCKIN).

When the current according to the current control code PIB' containing the correction current for correcting the current amount of the intermediate currents output from the transistors 131, 132, 141, and 142 flows in the gate voltage control circuit that controls the gate voltages VGBP' and VGBN', the current Ical', which is equal to the combined current of the current according to the current control code PIA and the current according to the current control code PIB', flows in the transistor 2307. Further, by the current mirror circuit formed of the transistor 2302 and the transistor 2303, the current Imax flows in the transistor 2303. Therefore, a differential pair consisting of the transistor 2308 and the transistor 2309 having the sources thereof commonly connected to the drain of the transistor 2303 and the drain of the transistor 2307, allows a current of (Imax−Ical') to flow to the phase interpolator circuit. The current Ical' is equal to the sum of the current according to the current control code PIA and the current according to the current control code PIB'. The current control code PIB' is the code value obtained by adding the current control code PIB and the correction code CAL' together, and the sum of the current according to the current control code PIA and the current according to the current control code PIB is constant. As a result, by subtracting the current Ical' containing the current equal to the correction current by the transistor 2307, even if the correction current varies, the amount of currents at the output ends OUTP and OUTN can be kept constant, inhibiting the common mode voltage from varying in response to the correction current.

Other Embodiments

Figure 13A:
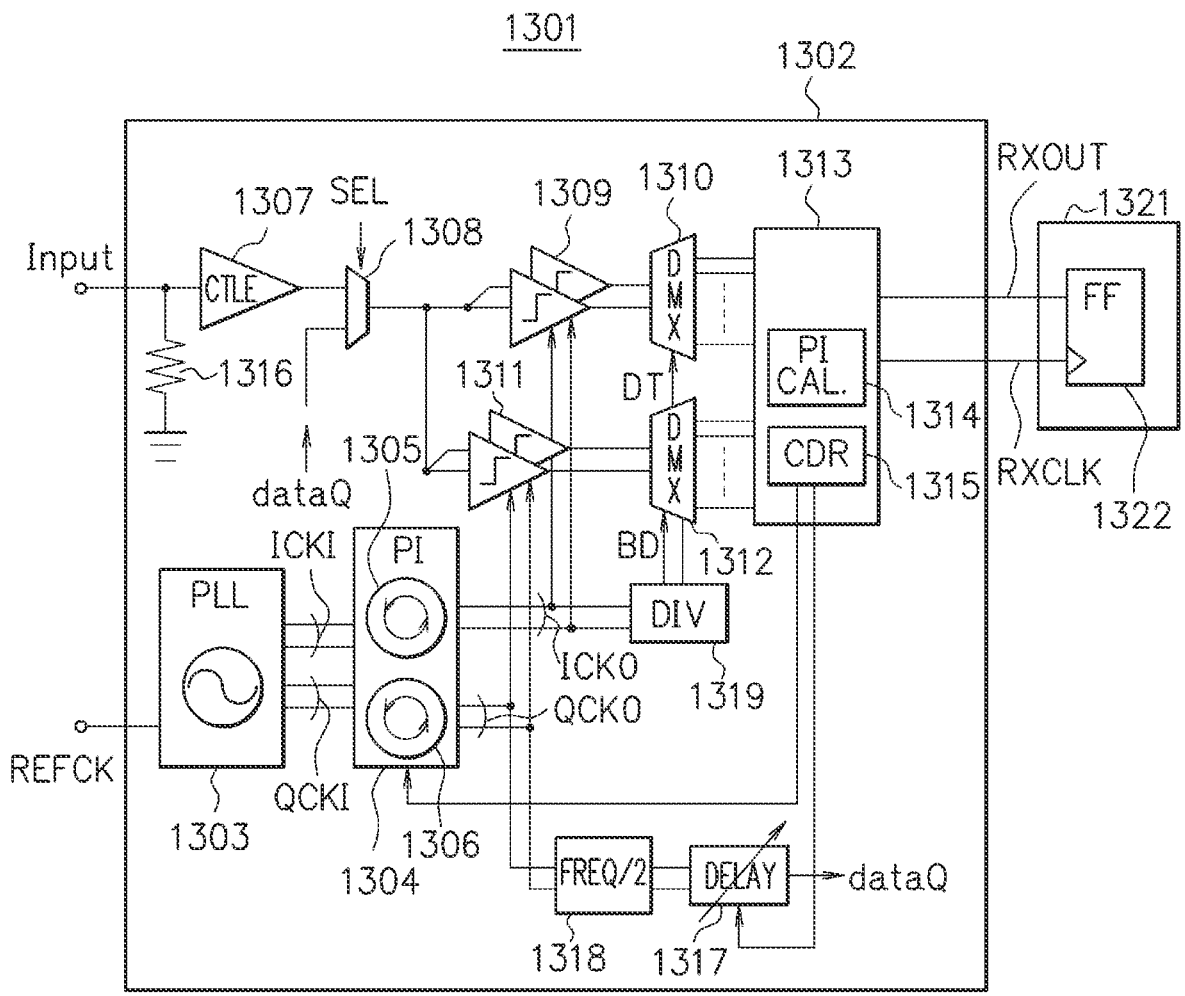
FIG. 13A is a diagram illustrating a configuration example of a semiconductor integrated circuit to which the phase interpolator circuit in this embodiment is applied.

FIG. 13A is a diagram illustrating a configuration example of a semiconductor integrated circuit in this embodiment. A semiconductor integrated circuit 1301 in this embodiment includes a reception circuit 1302 having the function of a deserializer circuit that converts an input serial signal into a parallel signal, and an internal circuit 1321 such as a logic circuit that receives the parallel signal (data signal) from the reception circuit 1302 to perform processing operations.

The reception circuit 1302 includes a PLL (Phase Locked Loop) circuit 1303, a phase interpolator circuit 1304, an equalizer circuit (CTLE: Continuous Time Linear Equalizer) 1307, a selector 1308, comparators 1309 and 1311, demultiplexer circuits 1310 and 1312, a digital processing circuit 1313, frequency dividing circuits 1318 and 1319, a variable delay circuit 1317, and a resistor 1316.

The PLL circuit 1303 generates and outputs clock signals to be supplied to the respective circuits in the semiconductor integrated circuit based on a reference clock signal REFCK to be input. For example, the PLL circuit 1303 generates and outputs, based on the input reference clock signal REFCK, the first input clock signal ICKI (ICKIP and ICKIN) and the second input clock signal QCKI (QCKIP and QCKIN) having a certain phase difference from the first input clock signal ICKI.

The phase interpolator circuit 1304 generates and outputs the output clock signals ICKO and QCKO each having a phase according to an input PI code based on the input clock signals ICKI and QCKI. The phase interpolator circuit 1304 includes a phase interpolator circuit 1305 that generates the first output clock signal ICKO and a phase interpolator circuit 1306 that generates the second output clock signal QCKO. The phase interpolator circuits 1305 and 1306 are the phase interpolator circuits in the first to sixth embodiments described above, and generate the output clock signals ICKO and QCKO, respectively, by weighting and synthesizing the input clock signals ICKI and QCKI based on the PI code.

The equalizer circuit 1307 receives an input serial signal Input transmitted via a transmission channel, or the like. The selector 1308 outputs one of the input serial signal Input received by the equalizer circuit 1307 and the internal data signal dataQ to the comparators 1309 and 1311 according to a control signal SEL. Normally, the input serial signal Input received by the equalizer circuit 1307 is output from the selector 1308, and the internal data signal dataQ is output from the selector 1308 when determining the correction code (during the calibration operation) or at another time.

The comparator 1309 acquires the data signal DT from an input signal using the first output clock signal ICKO output from the phase interpolator circuit 1304. The demultiplexer circuit 1310 performs a serial-to-parallel conversion on the output of the comparator 1309 based on the clock obtained by dividing the frequency of the first output clock signal ICKO output from the phase interpolator circuit 1304 by the frequency dividing circuit 1319, to then output a parallel data signal.

The comparator 1311 acquires the boundary signal BD from an input signal using the second output clock signal QCKO output from the phase interpolator circuit 1304. The demultiplexer circuit 1312 performs a serial-to-parallel conversion on the output of the comparator 1311 based on the clock obtained by dividing the frequency of the first output clock signal ICKO output from the phase interpolator circuit 1304 by the frequency dividing circuit 1319, to then output a parallel boundary signal.

Incidentally, the demultiplexer circuits 1310 and 1312 may perform a serial-to-parallel conversion on the outputs of the comparators 1309 and 1311 based on the clock obtained by dividing the frequency of the second output clock signal QCKO instead of the clock obtained by dividing the first output clock signal ICKO.

The digital processing circuit 1313 generates and outputs a reception data signal RXOUT and a reception clock signal RXCLK based on the data signal DT and the boundary signal BD output from the demultiplexer circuits 1310 and 1312. The reception data signal RXOUT output from the reception circuit 1302 is taken into the internal circuit 1321 by a flip-flop 1322 that operates with the reception clock signal RXCLK and is processed.

Further, the digital processing circuit 1313 includes a calibration control circuit 1314 and a CDR circuit 1315. The calibration control circuit 1314 performs control and other operations related to the calibration operation to determine the correction code.

Figure 15:
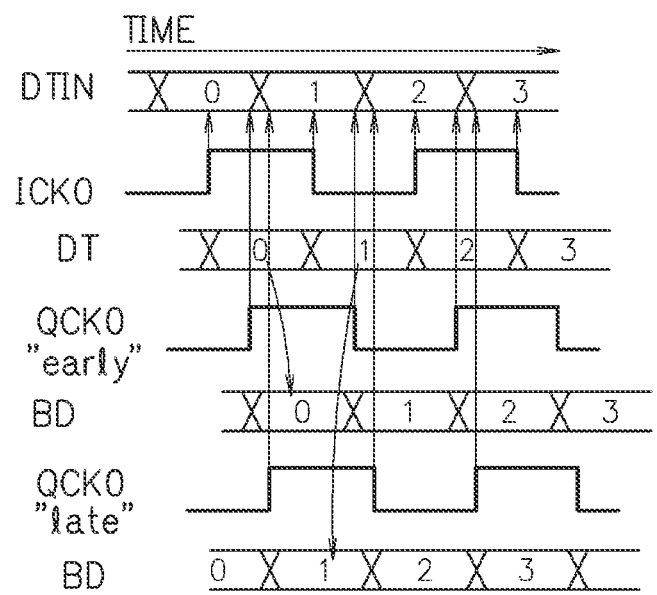
FIG. 15 is a view explaining an example of data reception in this embodiment.
Figure 16:
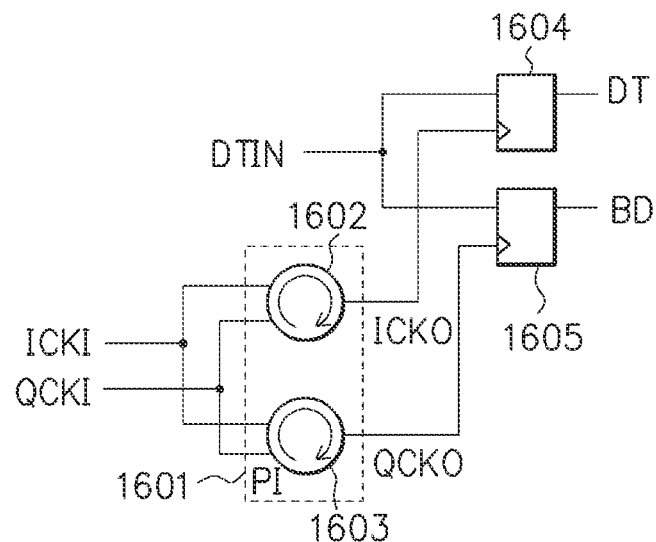
FIG. 16 is a diagram explaining a reception circuit of a deserializer.
Figure 17:
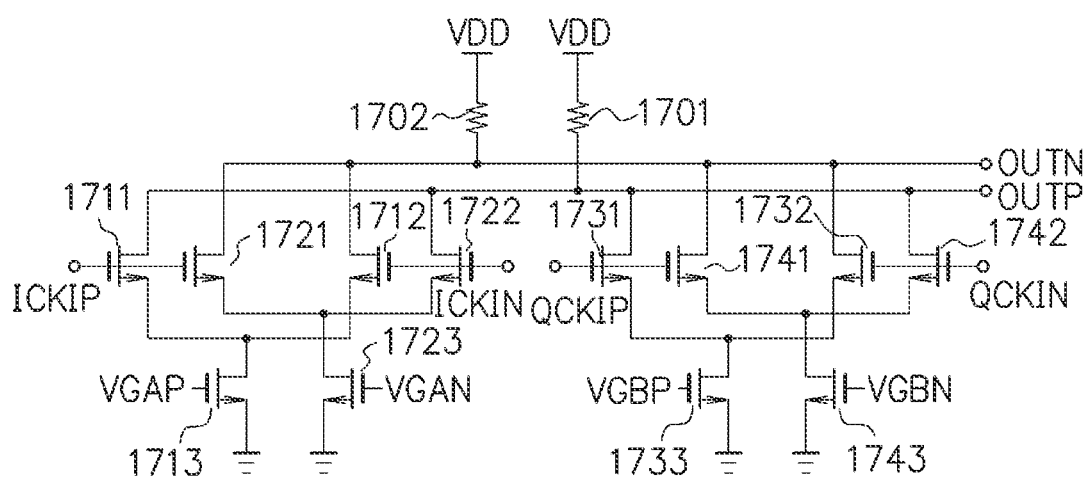
FIG. 17 is a diagram illustrating a configuration example of a phase interpolator circuit.
Figure 18:
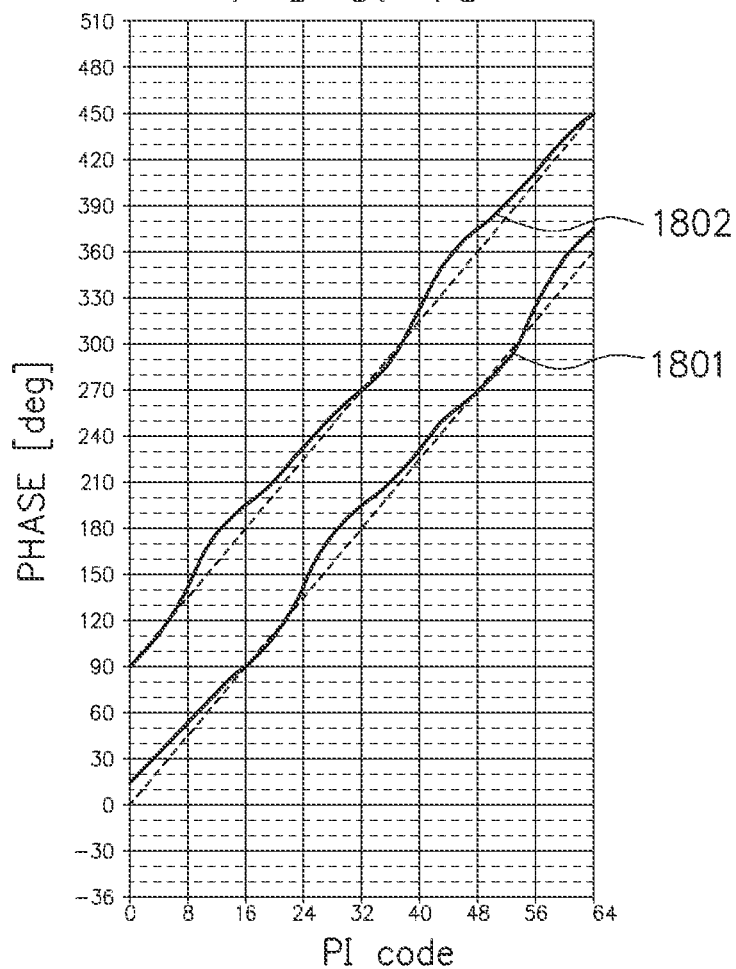
FIG. 18 is a view explaining a phase shift in an output of the phase interpolator circuit illustrated in FIG. 17.
Figure 19:
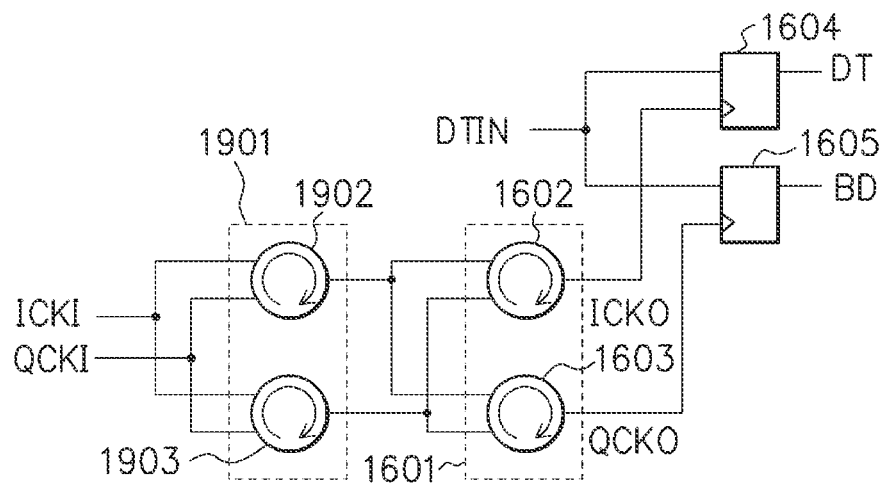
FIG. 19 is a diagram explaining a reception circuit provided with an input clock correction circuit.

The CDR circuit 1315 appropriately controls the phases of the output clock signals ICKO and QCKO output by the phase interpolator circuit 1304 based on the signals received from the demultiplexer circuits 1310 and 1312. As illustrated in FIG. 15, the CDR circuit 1315 determines whether the phases of the output clock signals ICKO and QCKO output by the phase interpolator circuit 1304 are advanced or delayed relative to an input serial signal DTIN based on the data signal DT and the boundary signal BD output from the demultiplexer circuits 1310 and 1312. The CDR circuit 1315 generates and outputs a PI code intended for advancing or delaying the phases of the output clock signals ICKO and QCKO according to the result of that determination.

Figure 13B:
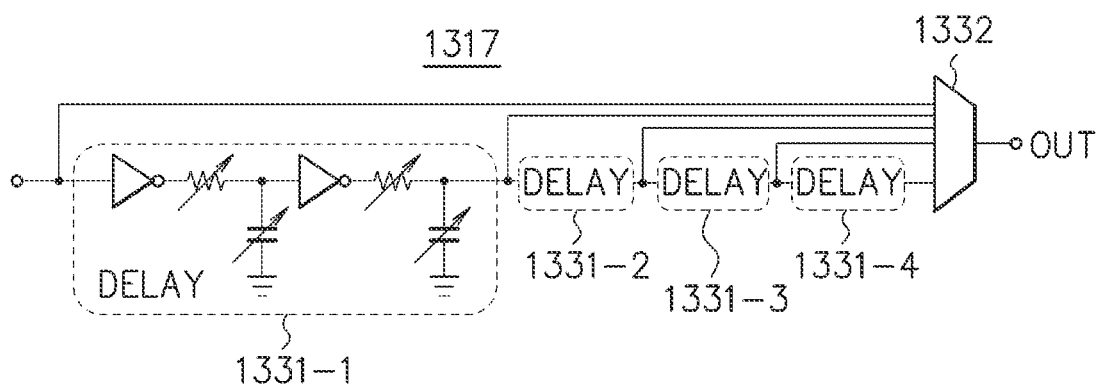
FIG. 13B is a diagram illustrating a configuration example of a variable delay circuit.

The frequency dividing circuit 1318 divides the frequency of the second output clock signal QCKO output from the phase interpolator circuit 1304 by two. The variable delay circuit 1317 delays the second output clock signal QCKO frequency-divided by the frequency dividing circuit 1318 and outputs the resultant as the internal data signal dataQ. The configuration of the variable delay circuit 1317 is not limited in particular, and any delay circuit capable of varying a delay amount can be applied. For example, as illustrated in FIG. 13B, the variable delay circuit 1317 may be configured to include unit delay circuits 1331 (1331-1, 1331-2, 1331-3, and 1331-4) including inverter circuits, resistors, and capacitors connected vertically, and a selection circuit 1332 that selects one of the outputs from the respective unit delay circuits 1331 to output it.

Figure 14:
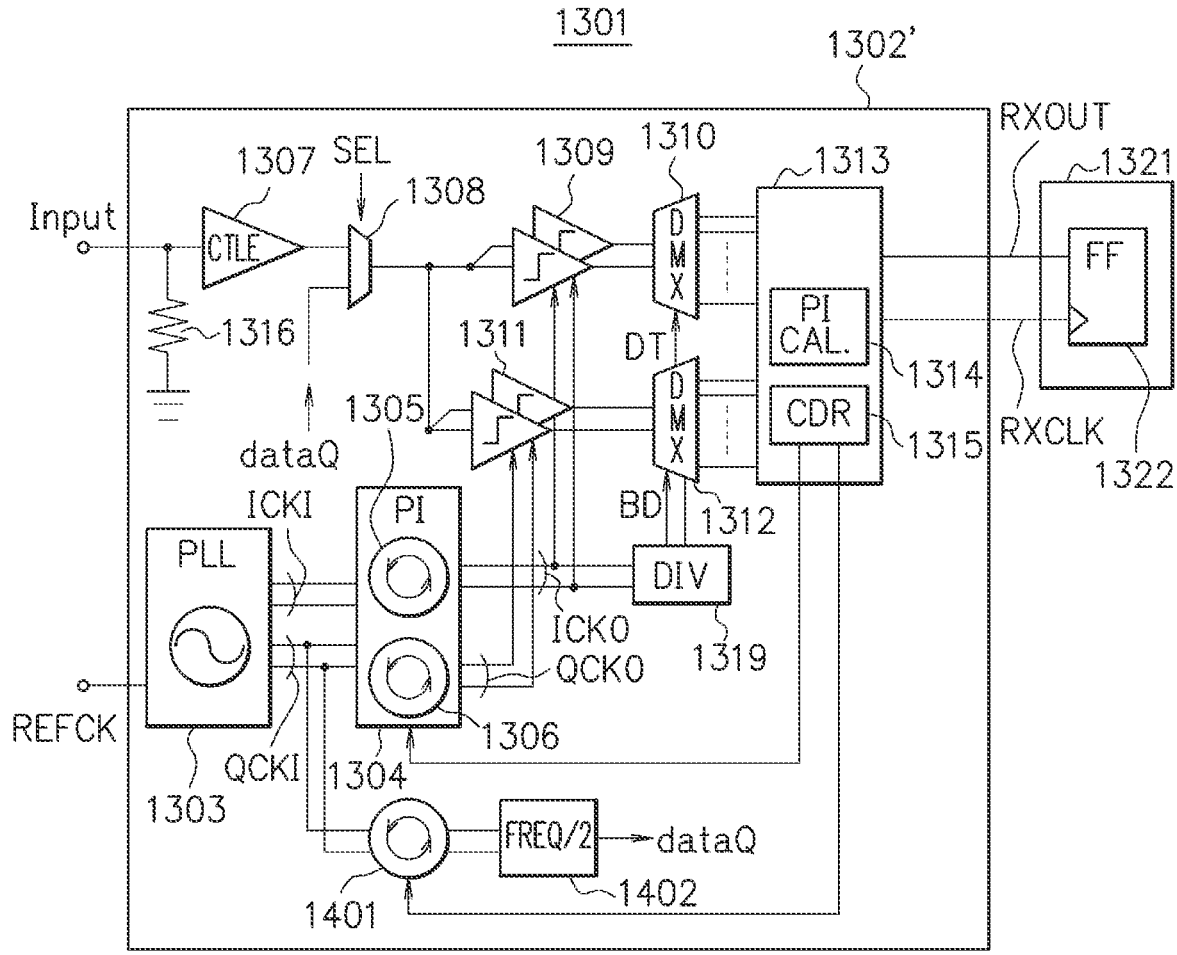
FIG. 14 is a diagram illustrating another configuration example of the semiconductor integrated circuit to which the phase interpolator circuit in this embodiment is applied.

Incidentally, the reception circuit 1302 in the semiconductor integrated circuit 1301 illustrated in FIG. 13A uses the second output clock signal QCKO output from the phase interpolator circuit 1304 to generate the internal data signal dataQ by the frequency dividing circuit 1318 and the variable delay circuit 1317. This embodiment is not limited to this, and as illustrated in FIG. 14, for example, the second input clock signal QCKI output from the PLL circuit 1303 may be used to generate the internal data signal dataQ by a phase interpolator circuit 1401 and a frequency dividing circuit 1402. Alternatively, a DLL circuit may be used to generate the internal data signal dataQ.

FIG. 14 is a diagram illustrating a configuration example of the semiconductor integrated circuit in this embodiment. In FIG. 14, components having the same functions as those illustrated in FIG. 13A are denoted by the same reference numerals and symbols, and redundant explanations are omitted. The phase interpolator circuit 1401 generates and outputs a clock signal equivalent to the output clock signal QCKO with an adjusted output phase, namely, an adjusted delay amount, based on the second input clock signal QCKI output from the PLL circuit 1303. The frequency dividing circuit 1402 divides the frequency of the clock signal output from the phase interpolator circuit 1401 by two and outputs it as the internal data signal dataQ.

Incidentally, the above embodiments merely illustrate concrete examples of implementing the present invention, and the technical scope of the present invention is not to be construed in a restrictive manner by the embodiments. That is, the present invention may be implemented in various forms without departing from the technical spirit or main features thereof.

The disclosed phase interpolator circuit can generate an output clock signal in which a phase shift in response to a phase interpolation code is inhibited.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

According to the embodiments, it is possible to provide a phase interpolator circuit that generates an output clock signal in which a phase shift in response to a phase interpolation code is inhibited.

What is claimed is:

1. A phase interpolator circuit configured to generate an output clock signal having a phase according to a phase interpolation code based on a first input clock signal and a second input clock signal having a first phase difference therebetween, the phase interpolator circuit comprising:
a first generation circuit configured to generate a first intermediate current based on the first input clock signal according to the phase interpolation code;
a second generation circuit configured to generate a second intermediate current based on the second input clock signal according to the phase interpolation code;
a synthesis circuit configured to synthesize the first intermediate current and the second intermediate current to generate the output clock signal; and
a correction circuit configured to correct a current amount of at least one of the first intermediate current and the second intermediate current based on a correction current according to a correction code set according to at least an amount of shift of the first phase difference from a certain value, wherein:
the first generation circuit includes a first transistor configured to operate as a current source, a first gate voltage according to the phase interpolation code being supplied to a gate of the first transistor,
the second generation circuit includes a second transistor configured to operate as a current source, a second gate voltage according to the phase interpolation code being supplied to a gate of the second transistor, and
the correction circuit includes a third transistor configured to operate as a current source, a third gate voltage according to the correction code being supplied to a gate of the third transistor.

2. The phase interpolator circuit according to claim 1, wherein
the correction circuit is configured to correct the current amount by generating the correction current according to the phase interpolation code and the correction code.

3. The phase interpolator circuit according to claim 2, wherein
the correction code is set to a fixed value according to the amount of shift of the first phase difference from the certain value.

4. The phase interpolator circuit according to claim 2, wherein
the correction code is set to a value according to the amount of shift of the first phase difference from the certain value and the phase interpolation code.

5. The phase interpolator circuit according to claim 1, wherein
the second generation circuit and the correction circuit are configured include, as the second transistor and the third transistor, a fourth transistor shared by the second generation circuit and the correction circuit and configured to operate as a current source, a fourth gate voltage according to the correction code and the phase interpolation code being supplied to a gate of the fourth transistor.

6. The phase interpolator circuit according to claim 5, wherein the correction circuit further includes a gate voltage control circuit configured to generate the fourth gate voltage based on the correction code and the phase interpolation code and supply the fourth gate voltage to the gate of the fourth transistor.

7. The phase interpolator circuit according to claim 1, wherein
the correction circuit further includes a gate voltage control circuit configured to generate the third gate voltage based on the correction code and the phase interpolation code and supply the third gate voltage to the gate of the third transistor.

8. The phase interpolator circuit according to claim 1, wherein
the first input clock signal, the second input clock signal, and the output clock signal are a differential signal, respectively, the phase interpolator circuit further comprising:
a common mode voltage correction circuit configured to inhibit variations in a common mode voltage in the output clock signal, the variations being caused according to the correction current.

9. The phase interpolator circuit according to claim 8, wherein
the common mode voltage correction circuit is configured to keep the sum of currents flowing in the phase interpolator circuit constant regardless of the correction current.

10. A reception circuit, comprising:
a phase interpolator circuit configured to generate an output clock signal having a phase according to a phase interpolation code based on a first input clock signal and a second input clock signal having a first phase difference therebetween;
a comparator configured to use the output clock signal generated by the phase interpolator circuit and acquire data signal from a received signal; and
a demultiplexer circuit configured to convert an output signal of the comparator into a parallel signal, wherein:
the phase interpolator circuit includes:
a first generation circuit configured to generate a first intermediate current based on the first input clock signal according to the phase interpolation code;
a second generation circuit configured to generate a second intermediate current based on the second input clock signal according to the phase interpolation code;
a synthesis circuit configured to synthesize the first intermediate current and the second intermediate current to generate the output clock signal; and
a correction circuit configured to correct a current amount of at least one of the first intermediate current and the second intermediate current based on a correction current according to a correction code set according to at least an amount of shift of the first phase difference from a certain value,
the first generation circuit includes a first transistor configured to operate as a current source, a first gate voltage according to the phase interpolation code being supplied to a gate of the first transistor, the second generation circuit includes a second transistor configured to operate as a current source, a second gate voltage according to the phase interpolation code being supplied to a gate of the second transistor, and the correction circuit includes a third transistor configured to operate as a current source, a third gate voltage according to the correction code being supplied to a gate of the third transistor.

11. The reception circuit according to claim 10, wherein the correction circuit is configured to correct the current amount by generating the correction current according to the phase interpolation code and the correction code.

12. The reception circuit according to claim 11, wherein the correction code is set to a fixed value according to the amount of shift of the first phase difference from the certain value.

13. The reception circuit according to claim 11, wherein the correction code is set to a value according to the amount of shift of the first phase difference from the certain value and the phase interpolation code.

14. The reception circuit according to claim 10, wherein the second generation circuit and the correction circuit are configured to include, as the second transistor and the third transistor, a fourth transistor shared by the second generation circuit and the correction circuit and configured to operate as a current source, a fourth gate voltage according to the correction code and the phase interpolation code being supplied to a gate of the fourth transistor.

15. The reception circuit according to claim 10, wherein the first input clock signal, the second input clock signal, and the output clock signal are a differential signal, respectively, and the phase interpolator circuit further includes a common mode voltage correction circuit configured to inhibit variations in a common mode voltage in the output clock signal, the variations being caused according to the correction current.

16. A semiconductor integrated circuit, comprising:

a phase interpolator circuit configured to generate an output clock signal having a phase according to a phase interpolation code based on a first input clock signal and a second input clock signal having a first phase difference therebetween;

a comparator configured to use the output clock signal generated by the phase interpolator circuit and acquire data from a received signal;

a demultiplexer circuit configured to perform a serial-parallel conversion on an output signal of the comparator to output a resultant signal, and an internal circuit configured to receive an output signal of the demultiplexer circuit and perform a processing operation, wherein:

the phase interpolator circuit includes:

a first generation circuit configured to generate a first intermediate current based on the first input clock signal according to the phase interpolation code;

a second generation circuit configured to generate a second intermediate current based on the second input clock signal according to the phase interpolation code;

a synthesis circuit configured to synthesize the first intermediate current and the second intermediate current to generate the output clock signal; and a correction circuit configured to correct a current amount of at least one of the first intermediate current and the second intermediate current based on a correction current according to a correction code set according to at least an amount of shift of the first phase difference from a certain value, the first generation circuit includes a first transistor configured to operate as a current source, a first gate voltage according to the phase interpolation code being supplied to a gate of the first transistor, the second generation circuit includes a second transistor configured to operate as a current source, a second gate voltage according to the phase interpolation code being supplied to a gate of the second transistor, and the correction circuit includes a third transistor configured to operate as a current source, a third gate voltage according to the correction code being supplied to a gate of the third transistor.

17. The semiconductor integrated circuit according to claim 16, wherein the correction circuit is configured to correct the current amount by generating the correction current according to the phase interpolation code and the correction code.

18. The semiconductor integrated circuit according to claim 17, wherein the correction code is set to a fixed value according to the amount of shift of the first phase difference from the certain value.

19. The semiconductor integrated circuit according to claim 17, wherein the correction code is set to a value according to the amount of shift of the first phase difference from the certain value and the phase interpolation code.

20. The semiconductor integrated circuit according to claim 16, wherein the second generation circuit and the correction circuit are configured to include, as the second transistor and the third transistor, a fourth transistor shared by the second generation circuit and the correction circuit and configured to operate as a current source, a fourth gate voltage according to the correction code and the phase interpolation code being supplied to a gate of the fourth transistor.

21. The semiconductor integrated circuit according to claim 20, wherein the first input clock signal, the second input clock signal, and the output clock signal are a differential signal, respectively, and the phase interpolator circuit further includes a common mode voltage correction circuit configured to inhibit variations in a common mode voltage in the output clock signal, the variations being caused according to the correction current.

* * * * *